US012787580B2

(12) United States Patent
Heo et al.

(10) Patent No.: US 12,787,580 B2
(45) Date of Patent: Nov. 3, 2026

(54) DISPLAY DEVICE

(71) Applicant: Samsung Display Co., LTD., Yongin-si (KR)

(72) Inventors: Ji Hye Heo, Yongin-si (KR); Na Ra On, Yongin-si (KR); Yun Kyeong In, Yongin-si (KR); Jun Young Jo, Yongin-si (KR)

(73) Assignee: Samsung Display Co., LTD., Gyeonggi-do (KR)

( * ) Notice: Subject to any disclaimer, the term of this patent is extended or adjusted under 35 U.S.C. 154(b) by 354 days.

(21) Appl. No.: 18/649,266

(22) Filed: Apr. 29, 2024

(65) Prior Publication Data

US 2025/0072235 A1 Feb. 27, 2025

(30) Foreign Application Priority Data

Aug. 21, 2023 (KR) ........................ 10-2023-0109026

(51) Int. Cl.
*H10K 59/00* (2023.01)
*H10K 59/131* (2023.01)

(52) U.S. Cl.
CPC .................................. *H10K 59/131* (2023.02)

(58) Field of Classification Search
CPC .. H10K 59/131; H10K 59/88; H10K 59/1213; H10K 59/123; H10K 77/10; H10W 46/00; G09G 3/3233; G09G 3/3275; G09G 2300/0426
USPC ............................................................ 257/91
See application file for complete search history.

(56) References Cited

U.S. PATENT DOCUMENTS

| | | | | |
|---|---|---|---|---|
| 7,190,000 B2 * | 3/2007 | Ryu | G02F 1/136227 257/E27.111 |
| 2014/0176844 A1 * | 6/2014 | Yanagisawa | G02F 1/1309 349/43 |
| 2018/0033354 A1 * | 2/2018 | Lee | G09G 3/006 |
| 2018/0284924 A1 * | 10/2018 | Watanabe | G06F 3/0412 |
| 2019/0304921 A1 * | 10/2019 | Kuroe | G02F 1/1333 |
| 2019/0393277 A1 * | 12/2019 | An | G02F 1/13452 |
| 2020/0035762 A1 * | 1/2020 | Kim | G02F 1/133322 |
| 2021/0217336 A1 * | 7/2021 | Lee | G09G 3/006 |

(Continued)

FOREIGN PATENT DOCUMENTS

| | | |
|---|---|---|
| KR | 10-2016-0017845 | 2/2016 |
| KR | 10-2020-0051099 | 5/2020 |

*Primary Examiner* — Sheikh Maruf
(74) *Attorney, Agent, or Firm* — Harness, Dickey & Pierce, P.L.C.

(57) ABSTRACT

A display device includes a substrate, a circuit layer, and an element layer. The substrate includes a main area including a display area in which light emitting areas are arranged and a non-display area, a sub-area, a hole area, and a hole peripheral area. The element layer includes light emitting elements disposed in the light emitting areas, respectively. The circuit layer includes light emitting pixel drivers electrically connected to the light emitting elements, respectively, data lines electrically connected to the light emitting pixel drivers, a crack sensing line disposed in the hole peripheral area, and a first sensing auxiliary line and a second sensing auxiliary line extending in parallel with the data lines, paired with two of the data lines crossing the hole peripheral area, respectively, and electrically connected to ends of the crack sensing line, respectively.

20 Claims, 14 Drawing Sheets

(56) References Cited

U.S. PATENT DOCUMENTS

| | | | | |
|---|---|---|---|---|
| 2022/0045140 A1* | 2/2022 | Bai | ........................ | G02F 1/1333 |
| 2022/0115465 A1* | 4/2022 | Yang | ...................... | G02F 1/1333 |
| 2022/0140021 A1* | 5/2022 | Li | ......................... | H10K 59/131 257/40 |
| 2022/0271229 A1* | 8/2022 | Kwak | ..................... | G09G 3/006 |
| 2022/0328574 A1* | 10/2022 | Jiang | ....................... | G01R 31/28 |

* cited by examiner

DHA: HADA11, HADA12, HADA21, HADA22
DL: DL1, DL2, DL3, DL3', INDL
INDL: CRD1, CRD2

DHA: HADA11, HADA12, HADA21, HADA22
DL: DL1, DL2, DL3, INDL
INDL: CRD1, CRD2

DHA: HADA11, HADA12, HADA21, HADA22
DL: DL1, DL2, DL3, INDL
INDL: CRD1, CRD2

DISPLAY DEVICE

CROSS-REFERENCE TO RELATED APPLICATION(S)

This application claims priority to and benefits of Korean Patent Application No. 10-2023-0109026 under 35 U.S.C. 119, filed on Aug. 21, 2023, in the Korean Intellectual Property Office (KIPO), the contents of which are incorporated herein by reference.

BACKGROUND

1. Technical Field

The disclosure relates to a display device.

2. Description of the Related Art

As an information society develops, the demand for a display device for displaying an image is increasing in various forms. For example, display devices have been applied to various electronic devices such as smartphones, digital cameras, laptop computers, navigation devices, and smart televisions.

The display device may be a flat panel display device such as a liquid crystal display device, a field emission display device, or a light emitting display device. The light emitting display device may include an organic light emitting display device including an organic light emitting element, an inorganic light emitting display device including an inorganic light emitting element such as an inorganic semiconductor, or a micro or nano light emitting display device including a micro or nano light emitting element.

The organic light emitting display device displays an image using multiple light emitting elements each including a light emitting layer made of an organic material. As such, as the organic light emitting display device implements image display using self-light emitting elements, the organic light emitting display device may have relatively superior performance in terms of power consumption, response speed, emission efficiency, luminance, and wide viewing angle compared to other display devices.

SUMMARY

A display device may include a substrate and an element layer disposed on the substrate.

The display device may further include an optical device and an acoustic device disposed below a hole area of the substrate. In order to secure a light path or a sound wave path, the display device may further include a penetrating portion disposed in the hole area of the substrate and penetrating through the substrate and the element layer.

However, as physical or chemical shock is applied to the substrate during the drilling process for preparing the penetrating portion, cracks may occur adjacent to the penetrating portion.

The cracks may gradually extend from a periphery of the hole area into a display area. The cracks may cause defects such as disconnection of lines, increased resistance of lines, and occurrence of oxygen or moisture permeation paths.

Aspects of the disclosure provide a display device capable of sensing cracks occurring adjacent to a hole area.

According to an embodiment of the disclosure, a display device may include a circuit layer disposed on a substrate, and an element layer disposed on the circuit layer. The substrate may include a main area including a display area in which light emitting areas are arranged and a non-display area arranged adjacent to the display area, a sub-area protruding from a side of the main area, a hole area surrounded by the main area, and a hole peripheral area disposed between the main area and the hole peripheral area. The element layer may include light emitting elements disposed in the light emitting areas, respectively. The circuit layer may include light emitting pixel drivers electrically connected to the light emitting elements, respectively, data lines electrically connected to the light emitting pixel drivers, a crack sensing line disposed in the hole peripheral area, and a first sensing auxiliary line and a second sensing auxiliary line extending in parallel with the data lines, paired with two of the data lines crossing the hole peripheral area, respectively, and electrically connected to ends of the crack sensing line, respectively.

Two or more of the data lines may be disposed between the first sensing auxiliary line and the second sensing auxiliary line in a direction crossing the data lines.

One of the data lines and another one of the data lines may be disposed between the first sensing auxiliary line and the second sensing auxiliary line in a direction crossing the data lines.

The circuit layer may further include a first sensing transmission line and a second sensing transmission line disposed in the non-display area, extending to the sub-area, and electrically connected to the first sensing auxiliary line and the second sensing auxiliary line, respectively. The first sensing auxiliary line may extend from the first sensing transmission line to an end of the crack sensing line. The second sensing auxiliary line may extend from the second sensing transmission line to another end of the crack sensing line.

Each of the first sensing transmission line and the second sensing transmission line may surround a periphery of the display area. Each of the first sensing auxiliary line and the second sensing auxiliary line may extend from a portion of the non-display area that is spaced apart from the sub-area to a side of the hole peripheral area opposite to the sub-area.

Each of the first sensing transmission line and the second sensing transmission line may be disposed in a portion of the non-display area adjacent to the sub-area. Each of the first sensing auxiliary line and the second sensing auxiliary line may extend from a portion of the non-display area adjacent to the sub-area to a side of the hole peripheral area facing the sub-area.

The circuit layer may further include first auxiliary lines extending in a first direction crossing the data lines and overlapping the light emitting pixel drivers in a plan view, and second auxiliary lines extending in parallel with the data lines, paired with the data lines, respectively, and including the first sensing auxiliary line and the second sensing auxiliary line. The data lines and the second auxiliary lines may be disposed on at least one insulating layer covering the first auxiliary lines.

The first auxiliary lines may include a first bypass auxiliary line electrically connected to a first data line of the data lines adjacent to the non-display area in the first direction. The second auxiliary lines further may include a second bypass auxiliary line paired with a second data line of the data lines spaced farther from the non-display area than the first data line in the first direction and electrically connected to the first bypass auxiliary line.

The display device may further include a display driving circuit transmitting data signals of the light emitting pixel drivers to the data lines. The circuit layer may further include data supply lines disposed in the non-display area and electrically connected between the data lines and the display driving circuit. The substrate may further include a bypass area disposed on a side of the display area and including a bypass middle area at the center, a first bypass side area that is parallel to the bypass middle area in the first direction and is in contact with the non-display area, and a second bypass side area disposed between the bypass middle area and the first bypass side area. The first data line may be disposed in the first bypass side area. The second data line may be disposed in the second bypass side area. A first data supply line of the data supply lines transmitting a data signal of the first data line may be electrically connected to the first data line through the first bypass auxiliary line and the second bypass auxiliary line. A second data supply line of the data supply lines transmitting a data signal of the second data line may be directly electrically connected to the second data line.

The substrate may further include a hole bypass area disposed between the hole peripheral area and the main area. The data lines may include hole cross data lines that cross the hole area or the hole peripheral area. The hole cross data line may include a first cross division portion adjacent to the sub-area and disposed between the non-display area and a side of the hole area, and a second cross division portion disposed between another side of the hole area and the non-display area. The first auxiliary lines may further include a first hole bypass line electrically connected to the first cross division portion, and a second hole bypass line electrically connected to the second cross division portion. The second auxiliary lines may further include a third hole bypass line electrically connecting the first hole bypass line and the second hole bypass line.

The circuit layer may further include a first power supply line and a second power supply line disposed in the non-display area and transmitting a first power and a second power for driving the light emitting elements, respectively. The first auxiliary lines may further include power auxiliary horizontal lines other than the first bypass auxiliary line, the first hole bypass line, and the second hole bypass line. The second auxiliary lines may further include power auxiliary vertical lines other than the first sensing auxiliary line, the second sensing auxiliary line, the second bypass auxiliary line, and the third hole bypass line. The power auxiliary horizontal lines and the power auxiliary vertical lines may be electrically connected to one of the first power supply line and the second power supply line.

The crack sensing line may be arranged in a horseshoe shape in a plan view including an inner side portion surrounding a periphery of the hole area, an outer side portion surrounding a periphery of the inner side portion, and connection portions connecting the inner side portion and the outer side portion.

According to an embodiment of the disclosure, a display device may include a circuit layer disposed on a substrate, and an element layer disposed on the circuit layer. The substrate may include a main area including a display area in which light emitting areas are arranged and a non-display area arranged adjacent to the display area, a sub-area protruding from a side of the main area; a hole area surrounded by the main area, and a hole peripheral area disposed between the main area and the hole peripheral area. The element layer may include light emitting elements disposed in the light emitting areas, respectively. The circuit layer may further include light emitting pixel drivers electrically connected to the light emitting elements, respectively, data lines electrically connected to the light emitting pixel drivers, first auxiliary lines extending in a first direction crossing the data lines and overlapping the light emitting pixel drivers in a plan view, second auxiliary lines extending in parallel with the data lines and paired with the data lines, respectively, and a crack sensing line disposed in the hole peripheral area. The second auxiliary lines may include a first sensing auxiliary line and a second sensing auxiliary line paired with two of the data lines crossing the hole peripheral area, respectively, and electrically connected to ends of the crack sensing line, respectively.

Two or more of the data lines may be disposed between the first sensing auxiliary line and the second sensing auxiliary line in a direction crossing the data lines.

One of the data lines and another one of the data lines may be disposed between the first sensing auxiliary line and the second sensing auxiliary line in a direction crossing the data lines.

The circuit layer may further include a first sensing transmission line and a second sensing transmission line disposed in the non-display area, extending to the sub-area, and electrically connected to the first sensing auxiliary line and the second sensing auxiliary line, respectively. The first sensing auxiliary line may extend from the first sensing transmission line to an end of the crack sensing line. The second sensing auxiliary line may extend from the second sensing transmission line to another end of the crack sensing line.

Each of the first sensing transmission line and the second sensing transmission line may surround the display area. Each of the first sensing auxiliary line and the second sensing auxiliary line may extend from a portion of the non-display area that is spaced apart from the sub-area to one side of the hole peripheral area opposite to the sub-area.

Each of the first sensing transmission line and the second sensing transmission line may be disposed in a portion of the non-display area adjacent to the sub-area. Each of the first sensing auxiliary line and the second sensing auxiliary line may extend from a portion of the non-display area adjacent to the sub-area to a side of the hole peripheral area facing the sub-area.

The display device may further include a display driving circuit transmitting data signals of the light emitting pixel drivers to the data lines. The circuit layer may further include data supply lines disposed in the non-display area and electrically connected between the data lines and the display driving circuit. The substrate may further include a bypass area disposed on a side of the display area and including a bypass middle area at the center, a first bypass side area that is parallel to the bypass middle area in the first direction and is in contact with the non-display area, and a second bypass side area disposed between the bypass middle area and the first bypass side area. The first auxiliary lines may include a first bypass auxiliary line electrically connected to a first data line of the data lines disposed in the first bypass side area. The second auxiliary lines may further include a second bypass auxiliary line paired with a second data line of the data lines disposed in the second bypass side area and electrically connected to the first bypass auxiliary line. A first data supply line of the data supply lines transmitting a data signal of the first data line may be electrically connected to the first data line through the first bypass auxiliary line and the second bypass auxiliary line. A second data supply line of the data supply lines transmitting a data signal of the second data line may be directly electrically connected to the second data line.

The substrate may further include a hole bypass area disposed between the hole peripheral area and the main area.

The data lines may include hole cross data lines that cross the hole area or the hole peripheral area. The hole cross data line may include a first cross division portion adjacent to the sub-area and disposed between the non-display area and a side of the hole area, and a second cross division portion disposed between another side of the hole area and the non-display area. The first auxiliary lines may further include a first hole bypass line electrically connected to the first cross division portion, and a second hole bypass line electrically connected to the second cross division portion. The second auxiliary lines may further include a third hole bypass line electrically connecting the first hole bypass line and the second hole bypass line.

The display device according to embodiments may include the circuit layer and the element layer disposed on the substrate. The substrate may include a display area in which light emitting areas are arranged, a main area including a non-display area disposed adjacent to the display area, a sub-area protruding from a side of the main area, a hole area surrounded by the main area, and a hole peripheral area disposed between the main area and the hole area. The element layer may include light emitting elements respectively disposed in the light emitting areas. The circuit layer may include light emitting pixel drivers each electrically connected to the light emitting elements, data lines electrically connected to the light emitting pixel drivers, a crack sensing line disposed in the hole peripheral area, and a first sensing auxiliary line and a second sensing auxiliary line that extend in parallel with the data lines and are electrically connected to sides of the crack sensing line. The first sensing auxiliary line and the second sensing auxiliary line may be paired with two of the data lines that cross the hole peripheral area, respectively.

The circuit layer of the display device according to embodiments may further include a first sensing transmission line and a second sensing transmission line disposed in the non-display area, extending into the sub-area, and electrically connected to the first sensing auxiliary line and the second sensing auxiliary line, respectively.

As such, the circuit layer of the display device according to embodiments may include the crack sensing line disposed in the hole peripheral area. An end of the crack sensing line may be electrically connected to the first sensing transmission line through the first sensing auxiliary line, and another end of the crack sensing line may be electrically connected to the second sensing transmission line through the second sensing auxiliary line.

Accordingly, it may be sensed whether the crack sensing line is damaged, for example, whether a crack has occurred in the hole peripheral area, from a voltage difference between the first sensing transmission line and the second sensing transmission line.

According to embodiments, the first sensing auxiliary line and the second sensing auxiliary line extending from the first sensing transmission line and the second sensing transmission line disposed in the non-display area to ends of the crack sensing line disposed in the hole peripheral area may be paired with two data lines that cross the hole peripheral area, respectively.

According to embodiments, the first sensing auxiliary line and the second sensing auxiliary line may not be provided as separate lines, but may be provided as portions of the second auxiliary lines that extend in parallel with the data lines, may be disposed on a same layer as the data lines, and may be paired with the data lines, respectively.

In this way, there is an advantage that there is no need to separately provide a mask process for arranging the first and second sensing auxiliary lines.

As the first and second sensing auxiliary lines and the data lines are disposed on a same layer, the crack transmitted to the circuit layer may be readily sensed.

Since the first sensing auxiliary line and the second sensing auxiliary line are covered with the data lines and a planarization layer covering the data lines, damage to the first sensing auxiliary line and the second sensing auxiliary line may be minimized. As a result, since the effect of damage to the first sensing auxiliary line and the second sensing auxiliary line on the voltage difference between the first sensing transmission line and the second sensing transmission line may be minimized or eliminated, reliability of sensing the crack may be improved.

However, effects according to the embodiments of the disclosure are not limited to those exemplified above and various other effects are incorporated herein.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
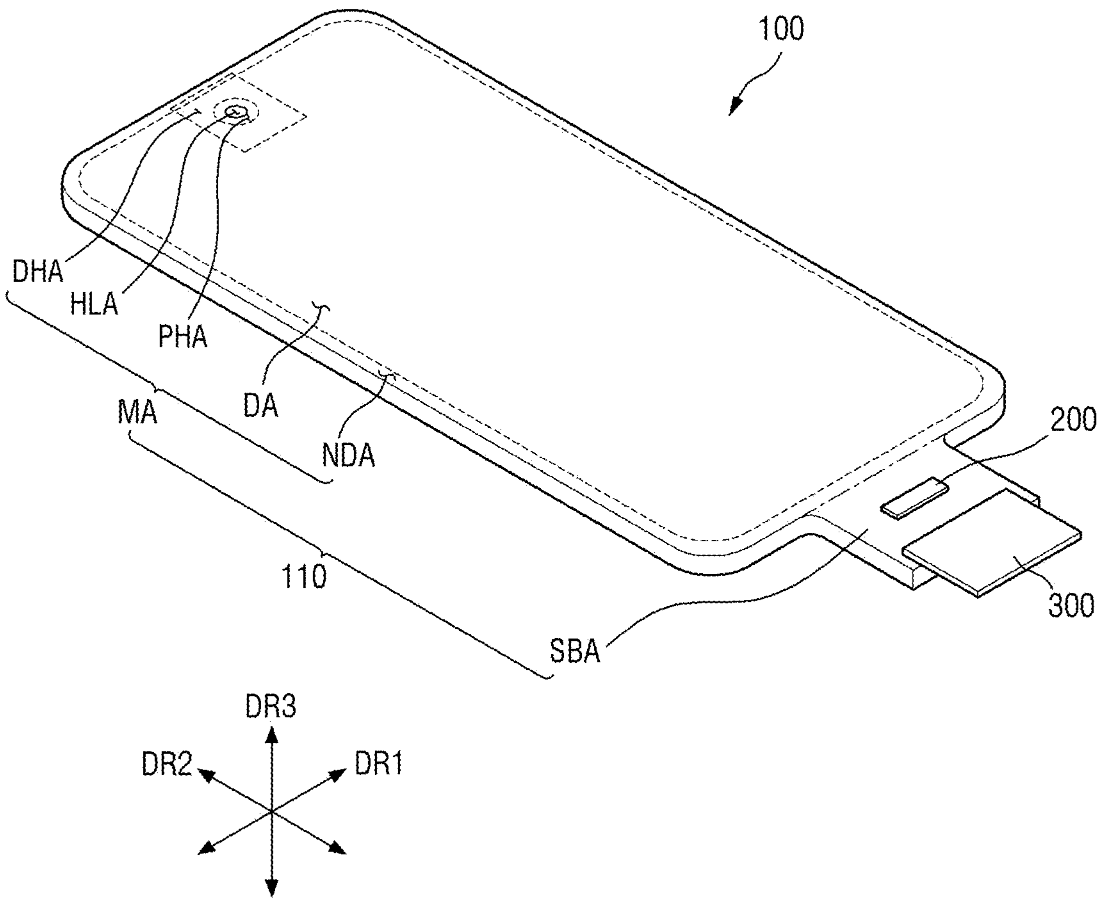
FIG. 1 is a perspective view of a display device according to embodiments.

Embodiments of the disclosure will now be described more fully hereinafter with reference to the accompanying drawings. The embodiments may, however, be provided in different forms and should not be construed as limiting. The same reference numbers indicate the same components throughout the disclosure. In the accompanying figures, the thickness of layers and regions may be exaggerated for clarity.

Some of the parts that are not associated with the description may not be provided in order to describe embodiments of the disclosure.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Also, when an element is referred to as being "in contact" or "contacted" or the like to another element, the element may be in "electrical contact" or in "physical contact" with another element; or in "indirect contact" or in "direct contact" with another element.

Further, the phrase "in a plan view" means when an object portion is viewed from above, and the phrase "in a schematic cross-sectional view" means when a schematic cross-section taken by vertically cutting an object portion is viewed from the side. The terms "overlap" or "overlapped" mean that a first object may be above or below or to a side of a second object, and/or vice versa. Additionally, the term "overlap" may include layer, stack, face or facing, extending over, covering, or partly covering or any other suitable term as would be appreciated and understood by those of ordinary skill in the art. The expression "not overlap" may include meaning such as "apart from" or "set aside from" or "offset from" and any other suitable equivalents as would be appreciated and understood by those of ordinary skill in the art. The terms "face" and "facing" may mean that a first object may directly or indirectly oppose a second object. In a case in which a third object intervenes between a first and second object, the first and second objects may be understood as being indirectly opposed to one another, although still facing each other.

The spatially relative terms "below," "beneath," "lower," "above," "upper," or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

It will be further understood that when the terms "comprises," "comprising," "has," "have," "having," "includes" and/or "including" are used, they may specify the presence of stated features, integers, steps, operations, elements and/or components, but do not preclude the presence or addition of other features, integers, steps, operations, elements, components, and/or any combination thereof.

It will be understood that, although the terms "first," "second," "third," or the like may be used herein to describe various elements, these elements should not be limited by these terms. These terms are used to distinguish one element from another element or for the convenience of description and explanation thereof. For example, when "a first element" is discussed in the description, it may be termed "a second element" or "a third element," and "a second element" and "a third element" may be termed in a similar manner without departing from the spirit and scope of the disclosure herein.

The terms "about" or "approximately" as used herein is inclusive of the stated value and means within an acceptable range of deviation for the particular value as determined by one of ordinary skill in the art, considering the measurement in question and the error associated with measurement of the particular quantity (for example, the limitations of the measurement system). For example, "about" may mean within one or more standard deviations, or within ±30%, 20%, 10%, 5% of the stated value.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or." For the purposes of this disclosure, "at least one of A and B" may be construed as A only, B only, or any combination of A and B. Also, "at least one of X, Y, and Z" and "at least one selected from the group consisting of X, Y, and Z" may be construed as X only, Y only, Z only, or any combination of two or more of X, Y, and Z.

Unless otherwise defined or implied, all terms used herein (including technical and scientific terms) have the same meaning as commonly understood by those skilled in the art to which the disclosure pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the specification.

Hereinafter, embodiments will be described with reference to the accompanying drawings.

Figure 2:
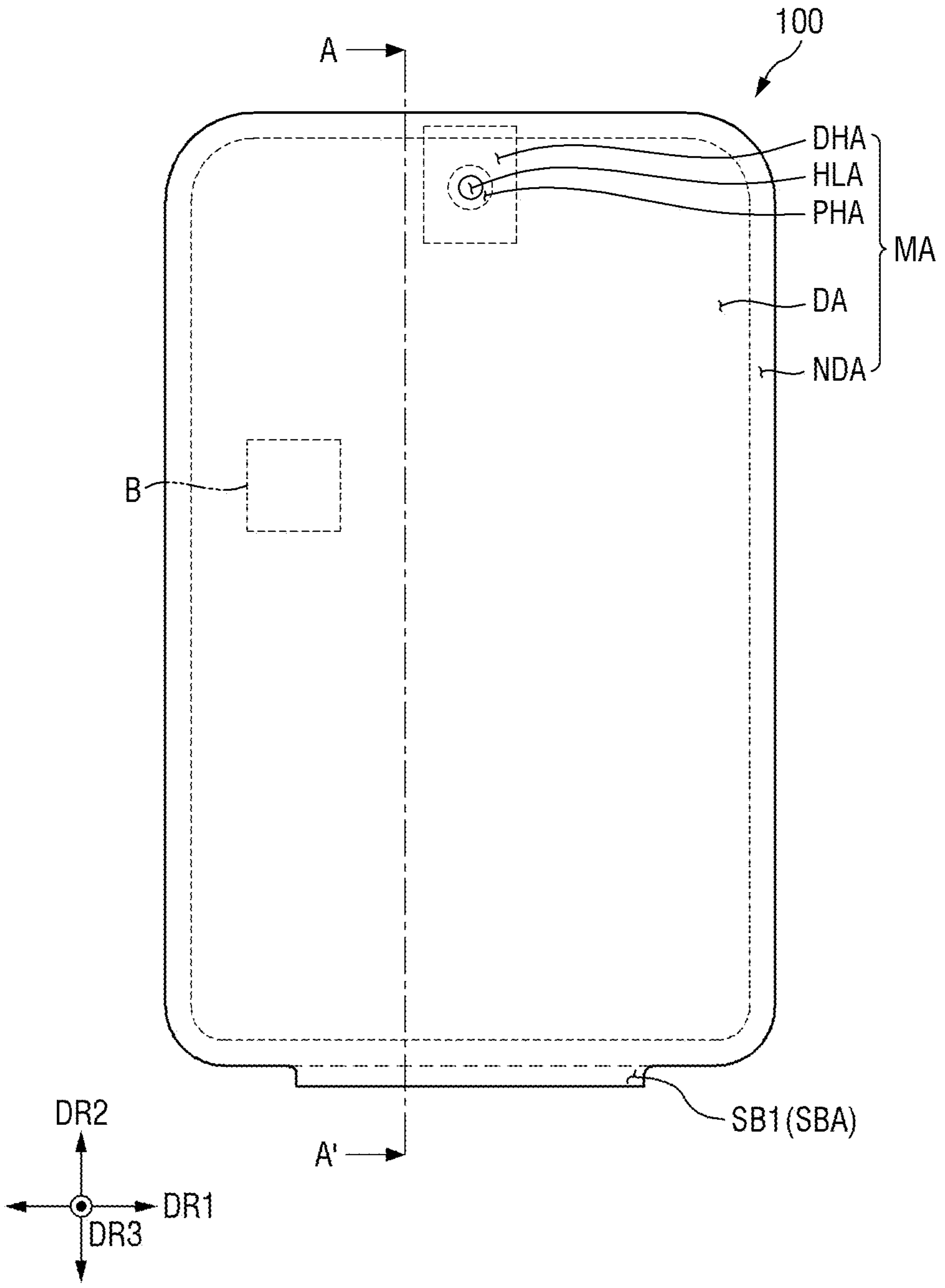
FIG. 2 is a plan view of the display device of FIG. 1.
Figure 3:
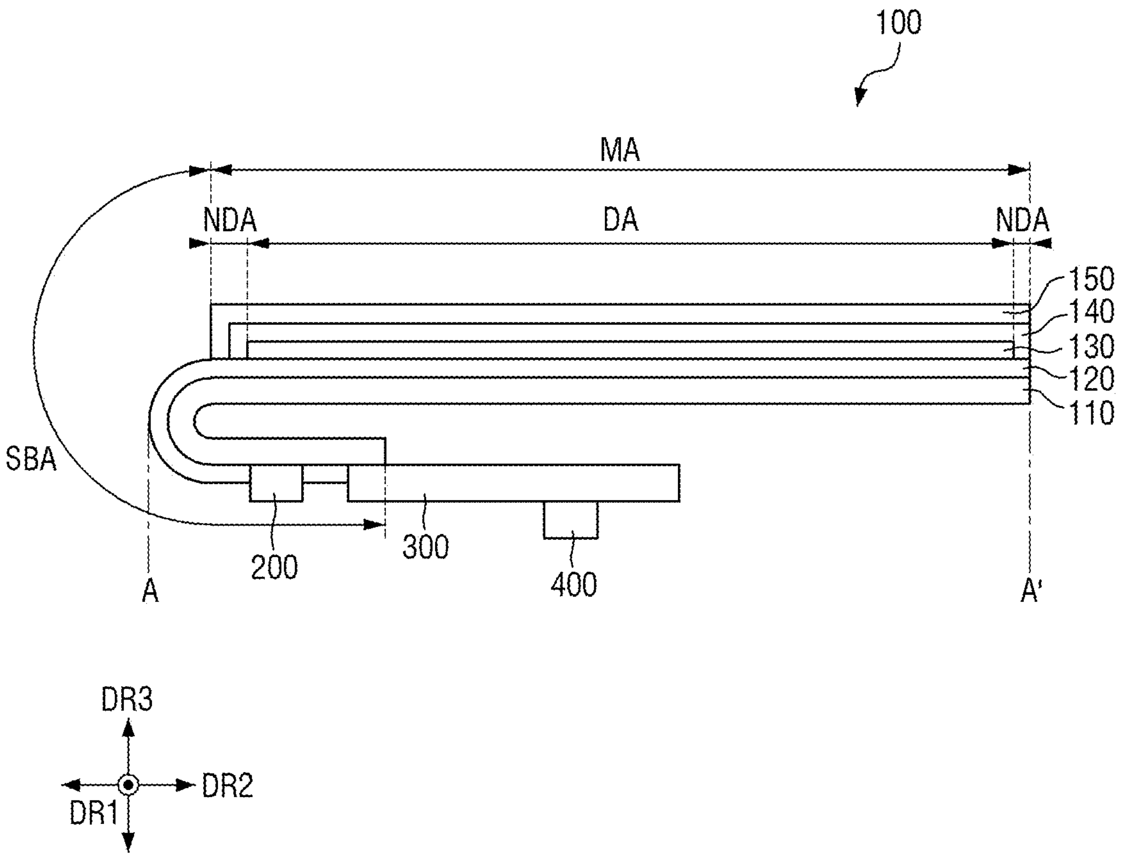
FIG. 3 is a schematic cross-sectional view taken along line A-A' of FIG. 2.
Figure 4:
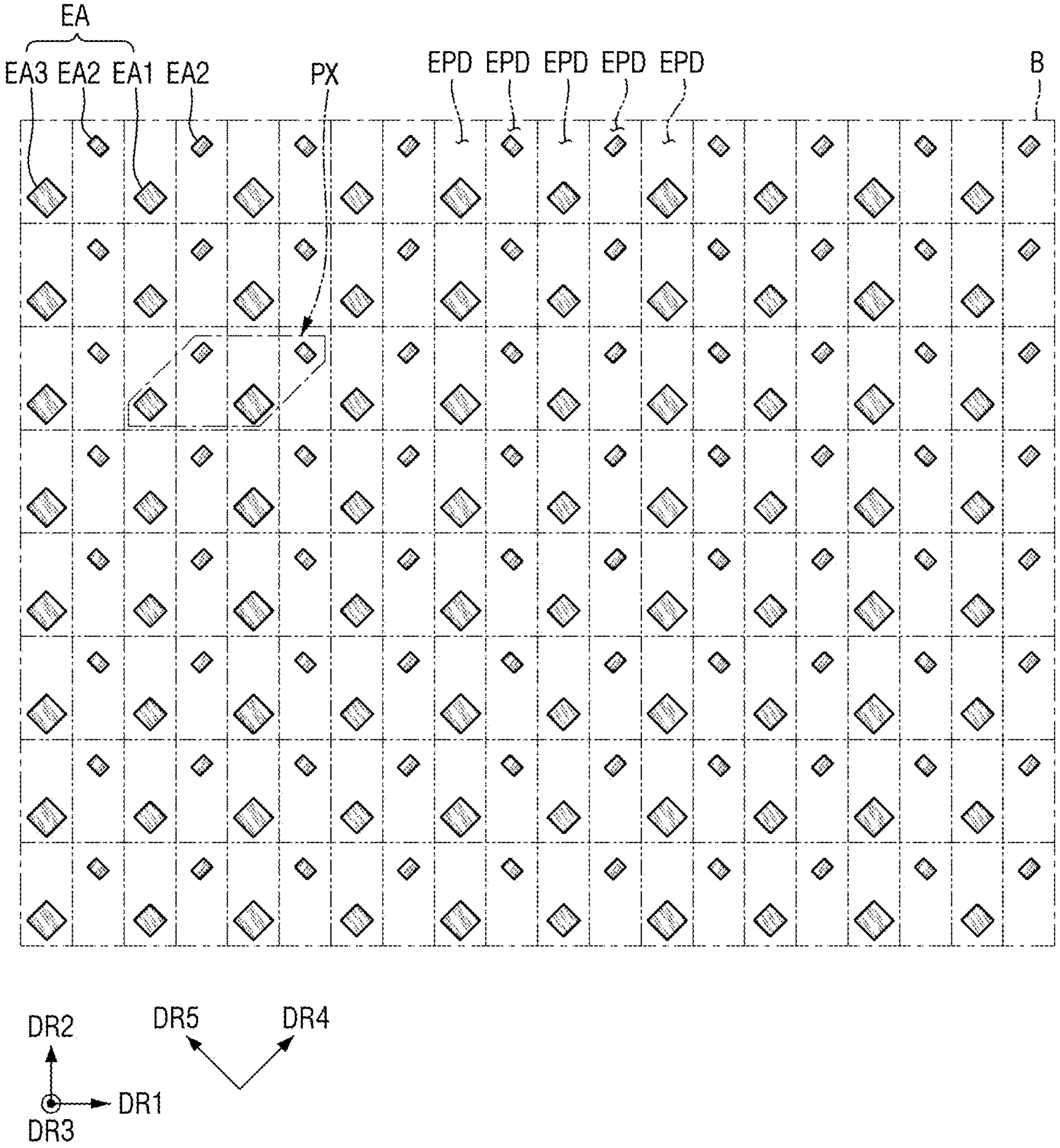
FIG. 4 is a plan view of portion B of FIG. 2.

FIG. 1 is a perspective view of a display device according to embodiments. FIG. 2 is a plan view of the display device of FIG. 1. FIG. 3 is a schematic cross-sectional view taken along line A-A' of FIG. 2. FIG. 4 is a plan view of portion B of FIG. 2.

Referring to FIGS. 1 and 2, a display device 100 may be a device that displays a moving image or a still image, and may be used as a display screen of various products such as a television, a laptop computer, a monitor, a billboard, and an Internet of Things (IOT) device as well as portable electronic devices such as a mobile phone, a smartphone, a tablet personal computer (PC), a smartwatch, a watch phone, a mobile communication terminal, an electronic organizer, an electronic book, a portable multimedia player (PMP), a navigation device, and an ultra mobile PC (UMPC).

The display device 100 may be a light emitting display device such as an organic light emitting display device using an organic light emitting diode, a quantum dot light emitting display device including a quantum dot light emitting layer, an inorganic light emitting display device including an inorganic semiconductor, and a micro light emitting display device using a micro or nano light emitting diode (micro or nano LED). Hereinafter, the description will be made based on an embodiment that the display device 100 is an organic light emitting display device. However, the disclosure is not limited thereto and may be applied to display devices including organic insulating materials, organic light emitting materials, and metal materials.

The display device 100 may be formed to be flat, but the disclosure is not limited thereto. For example, the display device 100 may include curved surface portions formed at left and right distal ends thereof and having a constant curvature or a variable curvature. In an embodiment, the display device 100 may be flexibly formed to be curved, bent, folded, or rolled.

As illustrated in FIGS. 1, 2, and 3, the display device 100 may include a substrate 110.

The substrate 110 may include a main area MA corresponding to a display surface of the display device 100, a sub-area SBA protruding from a side of the main area MA, a hole area HLA surrounded by the main area MA, and a hole peripheral area PHA disposed between the main area MA and the hole area HLA.

The substrate 110 may further include a hole bypass area DHA disposed between the hole peripheral area PHA and the main area MA.

As illustrated in FIGS. 1 and 2, the main area MA may include a display area DA disposed at most of the center and a non-display area NDA disposed adjacent to the display area DA.

The display area DA may be formed in a rectangular plane shape having a short side in a first direction DR1 and a long side in a second direction DR2 intersecting the first direction DR1. A corner where the short side in the first direction DR1 and the long side in the second direction DR2 meet may be rounded to have a curvature or may be formed at a right angle. The planar shape of the display area DA is not limited to the quadrangular shape, and the display area DA may be formed in other polygonal, circular, or oval shapes.

A penetrating portion (not illustrated) that penetrates through at least the substrate 110 may be disposed in the hole area HLA.

The penetrating portion may overlap an optical device or an acoustic device disposed below the substrate 110 in a plan view. The penetrating portion may be an incoming or outgoing light path for the optical device, or a sound wave path for the acoustic device.

A crack sensing line (DTCL in FIG. 7) that surrounds a periphery of the hole area HLA may be disposed in the hole peripheral area PHA.

Hole bypass lines (DTHL1, DTHL2, and DTHL3 in FIG. 10) of a data line (INDL in FIG. 10) that crosses with and is divided by the hole peripheral area PHA may be disposed in the hole bypass area DHA.

The non-display area NDA may be disposed at an edge of the main area MA to surround the display area DA in a plan view.

The sub-area SBA may be an area protruding from the non-display area NDA of the main area MA to a side in the second direction DR2.

As a portion of the sub-area SBA is deformed into a curved shape, another portion of the sub-area SBA may be disposed on a rear surface of the display device 100.

FIGS. 2 and 3 illustrate the display device 100 with a portion of the sub-area SBA curved.

Referring to FIG. 3, the display device 100 according to embodiments may include a substrate 110, a circuit layer 120 disposed on the substrate 110, and an element layer 130 disposed on the circuit layer 120.

The substrate 110 may be made of an insulating material such as a polymer resin. For example, the substrate 110 may be made of polyimide. The substrate 110 may be a flexible substrate that may be bent, folded, and rolled. In another embodiment, the substrate 110 may be made of an insulating material such as glass.

The element layer 130 may include light emitting elements (LE in FIG. 6) that emit light.

The circuit layer 120 may include light emitting pixel drivers (EPD in FIG. 4) that are electrically connected to the light emitting elements, respectively.

The display device 100 according to embodiments may further include a sealing layer 140 disposed on the element layer 130, and a touch sensor layer 150 disposed on the sealing layer 140.

The display device 100 according to embodiments may further include a polarizing layer (not illustrated) disposed on the touch sensor layer 150 to reduce reflection of external light.

Referring to FIG. 4, the display area DA of the substrate 110 of the display device 100 according to embodiments may include light emitting areas EA. The display area DA may further include a non-light emitting area disposed in a spaced portion between the light emitting areas EA.

The light emitting pixel drivers EPD each corresponding to the light emitting areas EA may be arranged in the display area DA in parallel with each other in the first direction DR1 and the second direction DR2. The light emitting pixel drivers EPD may be electrically connected to light emitting elements (LE in FIGS. 5 and 6) of the element layer 130 each disposed in the light emitting areas EA.

The light emitting areas EA may have a rhombic shape or a rectangular shape in a plan view. However, this is only an embodiment, and the planar shape of the light emitting areas EA is not limited to the embodiment illustrated in FIG. 4. For example, the light emitting areas EA may have a polygonal shape such as a square, pentagon, or hexagon, or a circular or oval shape including curved edges in a plan view.

The light emitting areas EA may include first light emitting areas EA1 that emit light of a first color in a wavelength band, second light emitting areas EA2 that emit light of a second color in a wavelength band lower than the wavelength band of the first color, and third light emitting areas EA3 that emit light of a third color in a wavelength band lower than the wavelength band of the second color.

For example, the first color may be red in a wavelength band in a range of approximately 600 nm to approximately 750 nm. The second color may be green in a wavelength band in a range of approximately 480 nm to approximately 560 nm. The third color may be blue in a wavelength band in a range of approximately 370 nm to approximately 460 nm.

The first light emitting areas EA1 and the third light emitting areas EA3 may be alternately disposed in at least one of the first direction DR1 and the second direction DR2.

The second light emitting areas EA2 may be arranged parallel to each other in at least one of the first direction DR1 and the second direction DR2.

The second light emitting areas EA2 may be adjacent to the first light emitting areas EA1 and the third light emitting areas EA3 in diagonal directions DR4 and DR5 intersecting the first and second directions DR1 and DR2.

Pixels PX that display each luminance and color may be provided in the first light emitting area EA1, the second light emitting area EA2, and the third light emitting area EA3 adjacent to each other among the light emitting areas EA.

In other words, the pixels PX may be basic units that display various colors, including white, at a luminance.

Each of the pixels PX may include at least one first light emitting area EA1, at least one second light emitting area EA2, and at least one third light emitting area EA3 adjacent to each other. Accordingly, each of the pixels PX may display various colors through mixing of light emitted from the first, second, and third light emitting areas EA1, EA2, and EA3 adjacent to each other.

Figure 5:
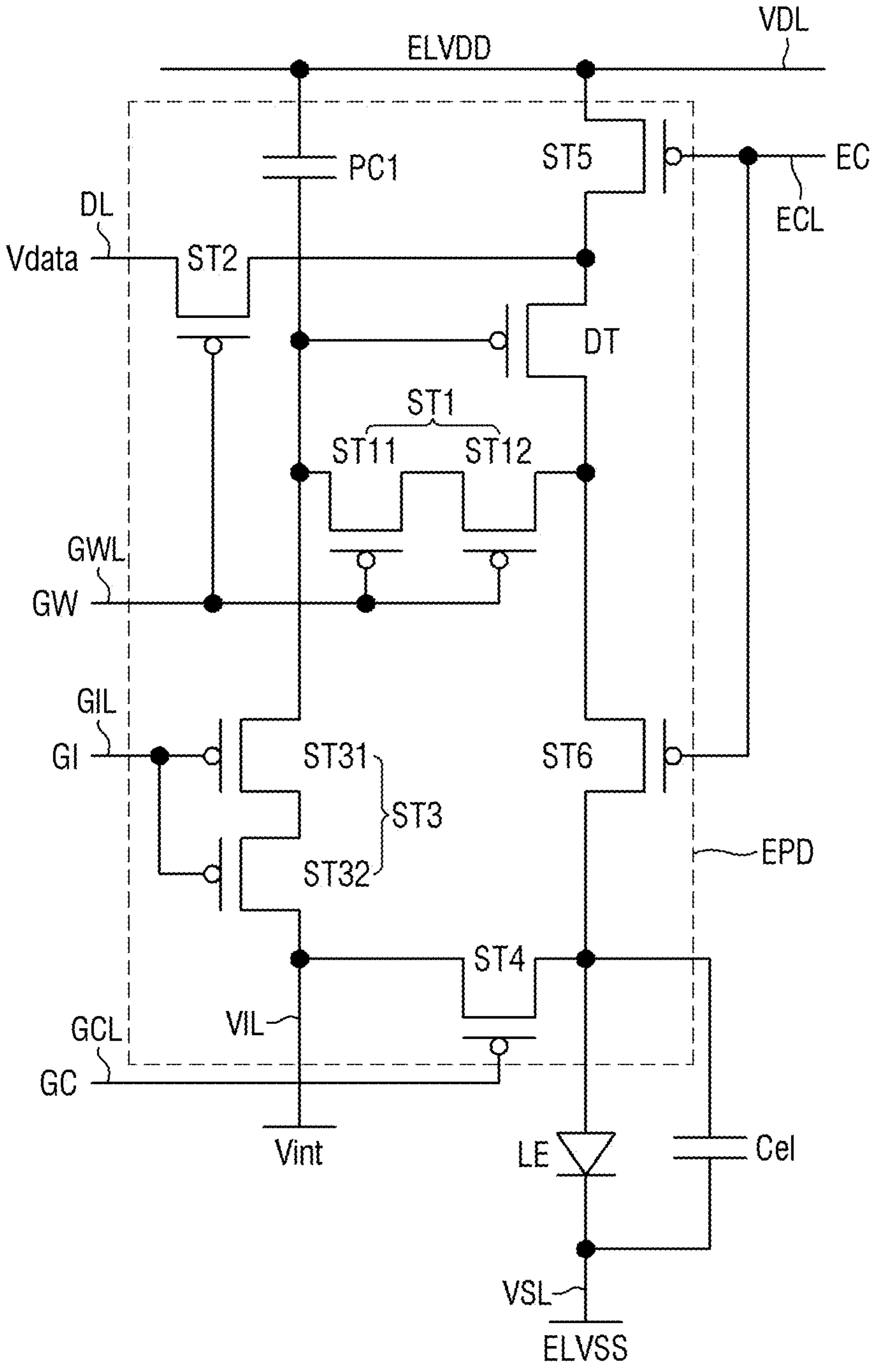
FIG. 5 is a schematic diagram of an equivalent circuit of a light emitting pixel driver of FIG. 4.

FIG. 5 is a schematic diagram of an equivalent circuit of a light emitting pixel driver of FIG. 4.

Referring to FIG. 5, one of the light emitting elements LE of the element layer 130 may be electrically connected between one of the light emitting pixel drivers EPD of the circuit layer 120 and a second power ELVSS.

For example, an anode electrode (131 in FIG. 6) of the light emitting element LE may be electrically connected to the light emitting pixel driver EPD, and the second power ELVSS having a voltage level lower than a first power ELVDD may be applied to a cathode electrode (134 in FIG. 6) of the light emitting element LE.

A capacitor Cel connected in parallel with the light emitting element LE may be a parasitic capacitance between the anode electrode 131 and the cathode electrode 134.

The circuit layer 120 may further include a first power line VDL that transmits the first power ELVDD and an initialization power line VIL that transmits an initialization power Vint.

The circuit layer 120 may further include a scan write line GWL that transmits a scan write signal GW, a scan initialization line GIL that transmits a scan initialization signal GI, an emission control line ECL that transmits an emission control signal EC, and a gate control line GCL that transmits a gate control signal GC.

A light emitting pixel driver EPD of the circuit layer 120 may include a driving transistor DT that generates a driving current for driving the light emitting element LE, two or more transistors ST2 to ST6 electrically connected to the driving transistor DT, and at least one capacitor PC1.

The driving transistor DT may be connected in series with the light emitting element LE between the first power ELVDD and the second power ELVSS.

For example, a first electrode (e.g., a source electrode) of the driving transistor DT may be electrically connected to the first power line VDL through a fifth transistor ST5. For example, a second electrode (e.g., a drain electrode) of the driving transistor DT may be electrically connected to the anode electrode 131 of the light emitting element LE through a sixth transistor ST6.

The first electrode of the driving transistor DT may be electrically connected to the data line DL through a second transistor ST2.

A gate electrode of the driving transistor DT may be electrically connected to the first power line VDL through a first capacitor PC1.

For example, the first capacitor PC1 may be electrically connected between the gate electrode of the driving transistor DT and the first power line VDL.

Accordingly, a potential of the gate electrode of the driving transistor DT may be maintained at a voltage charged in the first power line VDL.

In case that a data signal Vdata of the data line DL is transmitted to the first electrode of the driving transistor DT through a turned-on second transistor ST2, a voltage difference between the gate electrode of the driving transistor DT and the first electrode of the driving transistor DT may be a difference voltage between the first power ELVDD and the data signal Vdata.

In case that the voltage difference between the gate electrode of the driving transistor DT and the first electrode of the driving transistor DT, for example, a gate-source voltage difference is a threshold voltage or more, the driving transistor DT may be turned on, thereby generating a drain-source current of the driving transistor DT corresponding to the data signal Vdata.

In case that the fifth transistor ST5 and the sixth transistor ST6 are turned on, the driving transistor DT may be connected in series with the light emitting element LE between the first power line VDL and a second power line VSL. Accordingly, the drain-source current of the driving transistor DT corresponding to the data signal Vdata may be supplied as a driving current of the light emitting element LE.

Accordingly, the light emitting element LE may emit light with luminance corresponding to the data signal Vdata.

A first transistor ST1 may be electrically connected between the gate electrode of the driving transistor DT and the second electrode of the driving transistor DT.

The first transistor ST1 may include multiple sub-transistors connected in series. For example, the first transistor ST1 may include a first sub-transistor ST11 and a second sub-transistor ST12.

A first electrode of the first sub-transistor ST11 may be connected to the gate electrode of the driving transistor DT, a second electrode of the first sub-transistor ST11 may be connected to a first electrode of the second sub-transistor ST12, and a second electrode of the second sub-transistor ST12 may be connected to the second electrode of the driving transistor DT.

The second transistor ST2 may be electrically connected between the first electrode of the driving transistor DT and the data line DL.

The first sub-transistor ST11, the second sub-transistor ST12, and the second transistor ST2 may be turned on by the scan write signal GW of the scan write line GWL.

A third transistor ST3 may be connected between the gate electrode of the driving transistor DT and the initialization power line VIL.

The third transistor ST3 may include multiple sub-transistors connected in series. For example, the third transistor ST3 may include a third sub-transistor ST31 and a fourth sub-transistor ST32.

A first electrode of the third sub-transistor ST31 may be connected to the gate electrode of the driving transistor DT, a second electrode of the third sub-transistor ST31 may be connected to a first electrode of the fourth sub-transistor ST32, and a second electrode of the fourth sub-transistor ST32 may be connected to the initialization power line VIL.

The third sub-transistor ST31 and the fourth sub-transistor ST32 may be turned on by the scan initialization signal GI of the scan initialization line GIL.

A fourth transistor ST4 may be electrically connected between the anode electrode of the light emitting element LE and the initialization power line VIL. The fourth transistor ST4 may be turned on by the gate control signal GC of the gate control line GCL.

The fifth transistor ST5 may be electrically connected between the first electrode of the driving transistor DT and the first power line VDL.

The sixth transistor ST6 may be electrically connected between the second electrode of the driving transistor DT and the anode electrode 131 of the light emitting element LE.

The fifth transistor ST5 and the sixth transistor ST6 may be turned on by the emission control signal EC of the emission control line ECL.

As illustrated in FIG. 5, the driving transistor DT, the second transistor ST2, the fourth to sixth transistors ST4, ST5, and ST6, and the first to fourth sub-transistors ST11, ST12, ST31, and ST32 may be provided as P-type MOSFETs. However, the disclosure is not limited thereto, and the first and third transistors ST1 and ST3 electrically connected to the gate electrode of the driving transistor DT may be N-type MOSFETs.

Figure 6:
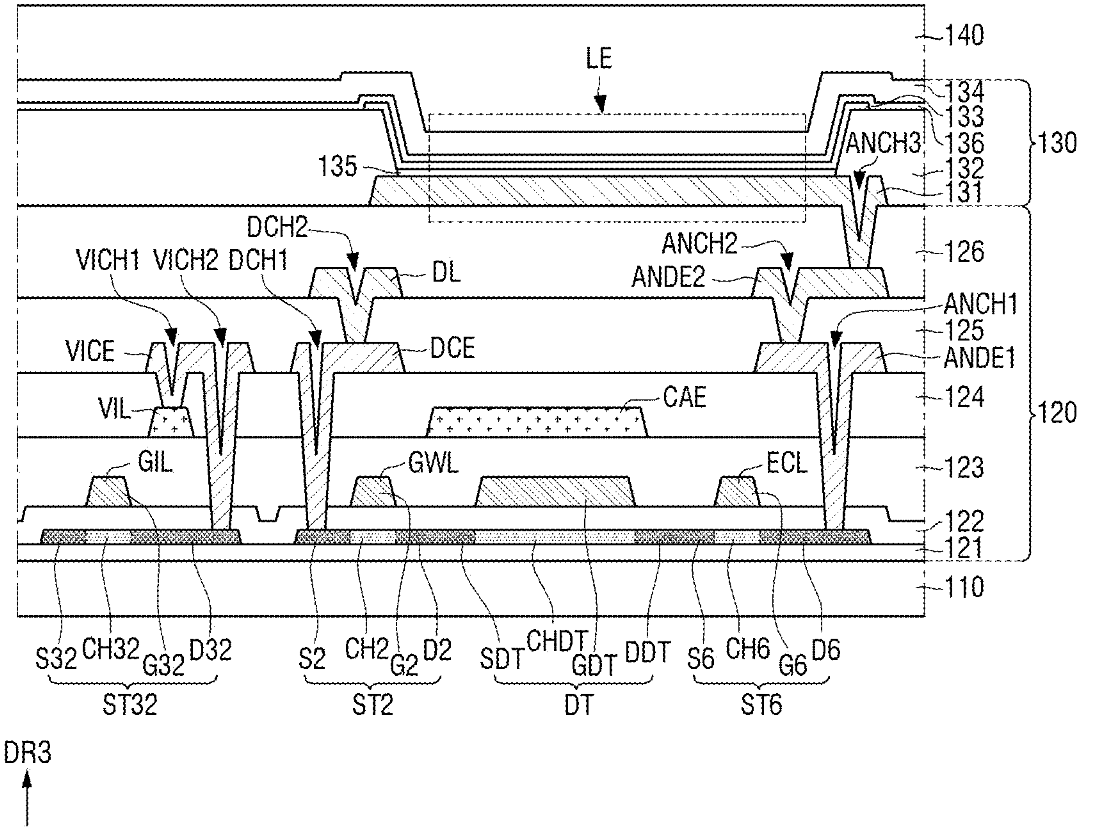
FIG. 6 is a schematic cross-sectional view illustrating a driving transistor, a second transistor, a fourth sub-transistor, and a sixth transistor of FIG. 5 and a light-emitting element.

FIG. 6 is a schematic cross-sectional view illustrating a driving transistor, a second transistor, a fourth sub-transistor, and a sixth transistor of FIG. 5 and a light-emitting element.

Referring to FIG. 6, the circuit layer 120 of the display device 100 according to embodiments may include a buffer layer 121 covering the substrate 110, semiconductor layers CHDT, SDT, DDT, CH2, S2, D2, CH32, S32, D32, CH6, S6, and D6 disposed on the buffer layer 121, a first gate insulating layer 122 covering the semiconductor layers, first gate conductive layers GDT, G2, G32, and G6 disposed on the first gate insulating layer 122, a second gate insulating layer 123 covering the first gate conductive layers, a second gate conductive layer VIL and CAE disposed on the second gate insulating layer 123, an interlayer insulating layer 124 covering the second gate conductive layers, first source/drain conductive layer ANDE1, DCE, and VICE disposed on the interlayer insulating layer 124, a first planarization layer 125 covering the first source/drain conductive layers, second source/drain conductive layer ANDE2 and DL disposed on the first planarization layer 125, and a second planarization layer 126 covering the second source/drain conductive layers.

The driving transistor DT may include a channel portion CHDT, a source portion SDT, and a drain portion DDT disposed in the semiconductor layer on the buffer layer 121, and a gate electrode GDT disposed in the first gate conductive layer on the first gate insulating layer 122 and overlapping the channel portion CHDT in a plan view.

The second transistor ST2 may include a channel portion CH2, a source portion S2, and a drain portion D2 disposed in the semiconductor layer on the buffer layer 121, and a gate electrode G2 disposed in the first gate conductive layer on the first gate insulating layer 122 and overlapping the channel portion CH2 in a plan view.

The drain portion D2 of the second transistor ST2 may be connected to the source portion SDT of the driving transistor DT.

The source portion S2 of the second transistor ST2 may be electrically connected to the data line DL through a data connection electrode DCE.

The data connection electrode DCE may be disposed in the first source/drain conductive layer on the interlayer insulating layer 124, and may be electrically connected to the source portion S2 of the second transistor ST2 through a first data connection hole DCH1 penetrating through the interlayer insulating layer 124, the second gate insulating layer 123, and the first gate insulating layer 122.

The data line DL may be disposed in the second source/drain conductive layer on the first planarization layer 125, and may be electrically connected to the data connection electrode DCE through a second data connection hole DCH2 penetrating through the first planarization layer 125.

The gate electrode G2 of the second transistor ST2 may be provided as a portion of the scan write line GWL.

The fourth sub-transistor ST32 may include a channel portion CH32, a source portion S32, and a drain portion D32 disposed in the semiconductor layer on the buffer layer 121, and a gate electrode G32 disposed in the first gate conductive layer on the first gate insulating layer 122 and overlapping the channel portion CH32 in a plan view.

The gate electrode G32 of the fourth sub-transistor ST32 may be provided as a portion of the scan initialization line GIL.

The source portion S32 of the fourth sub-transistor ST32 may be connected to the drain portion of the third sub-transistor ST31.

The drain portion D32 of the fourth sub-transistor ST32 may be connected to the initialization power line VIL.

For example, the initialization power line VIL may be disposed in the second gate conductive layer on the second gate insulating layer 123.

The initialization power line VIL may be electrically connected to the drain portion D32 of the fourth sub-transistor ST32 through an initialization connection electrode VICE disposed in the first source/drain conductive layer on the interlayer insulating layer 124.

The initialization connection electrode VICE may be electrically connected to the initialization power line VIL through a first initialization connection hole VICH1, and may be electrically connected to the drain portion D32 of the fourth sub-transistor ST32 through a second initialization connection hole VICH2.

The sixth transistor ST6 may include a channel portion CH6, a source portion S6, and a drain portion D6 disposed in the semiconductor layer on the buffer layer 121, and a gate electrode G6 disposed in the first gate conductive layer on the first gate insulating layer 122 and overlapping the channel portion CH6 in a plan view.

The gate electrode G6 of the sixth transistor ST6 may be provided as a portion of the emission control line ECL.

The source portion S6 of the sixth transistor ST6 may be connected to the drain portion DDT of the driving transistor DT.

The drain portion D6 of the sixth transistor ST6 may be electrically connected to the anode electrode 131 through a first anode connection electrode ANDE1 and a second anode connection electrode ANDE2.

The first anode connection electrode ANDE1 may be disposed in the first source/drain conductive layer on the interlayer insulating layer 124, and may be electrically connected to the drain portion D6 of the sixth transistor ST6 through a first anode connection hole ANCH1 penetrating through the interlayer insulating layer 124, the second gate insulating layer 123, and the first gate insulating layer 122.

The second anode connection electrode ANDE2 may be disposed in the second source/drain conductive layer on the first planarization layer 125, and may be electrically connected to the first anode connection electrode ANDE1 through a second anode connection hole ANCH2 penetrating through the first planarization layer 125.

The anode electrode 131 may be disposed on the second planarization layer 126, and may be electrically connected to the second anode connection electrode ANDE2 through a third anode connection hole ANCH3 penetrating through the second planarization layer 126.

The first capacitor PC1 may be provided in an overlap area between a capacitor electrode CAE disposed in the second gate conductive layer on the second gate insulating layer 123 and the gate electrode GDT of the driving transistor DT.

The first transistor ST1, the fourth transistor ST4, the fifth transistor ST5, and the first to third sub-transistors ST11, ST12, and ST31 may have a similar structure to the driving transistor DT, the second transistor ST2, the sixth transistor ST6, and the fourth sub-transistor ST32, and thus redundant descriptions are omitted.

The element layer 130 may include an anode electrode 131 disposed on the second planarization layer 126, a pixel defining layer 132 disposed on the second planarization layer 126 and corresponding to a spaced area between the light emitting areas EA, a light emitting layer 133 disposed on the anode electrode 131, and a cathode electrode 134 disposed on the pixel defining layer 132 and the light emitting layer 133.

The anode electrode 131 and the light emitting layer 133 may be disposed in each of the light emitting areas EA.

The cathode electrode 134 may be disposed entirely in the display area DA including the light emitting areas EA.

The element layer 130 may further include a first common layer 135 disposed between the anode electrode 131 and the light emitting layer 133, and a second common layer 136 disposed between the light emitting layer 133 and the cathode electrode 134.

The first common layer 135 may include a hole transporting layer corresponding to each of the light emitting areas EA and made of an organic material with hole transport properties. In an embodiment, the first common layer 135 may further include a hole injection layer disposed between the anode electrode 131 and the hole transporting layer and made of an organic material with hole injection properties.

The second common layer 136 may include an electron transporting layer entirely corresponding to the light emitting areas EA and made of an organic material with electron transport properties. In an embodiment, the second common layer 136 may further include an electron injection layer disposed between the electron transporting layer and the cathode electrode 134 and made of an organic material with electron injection properties.

The element layer 130 may be covered with the sealing layer 140.

Figure 7:
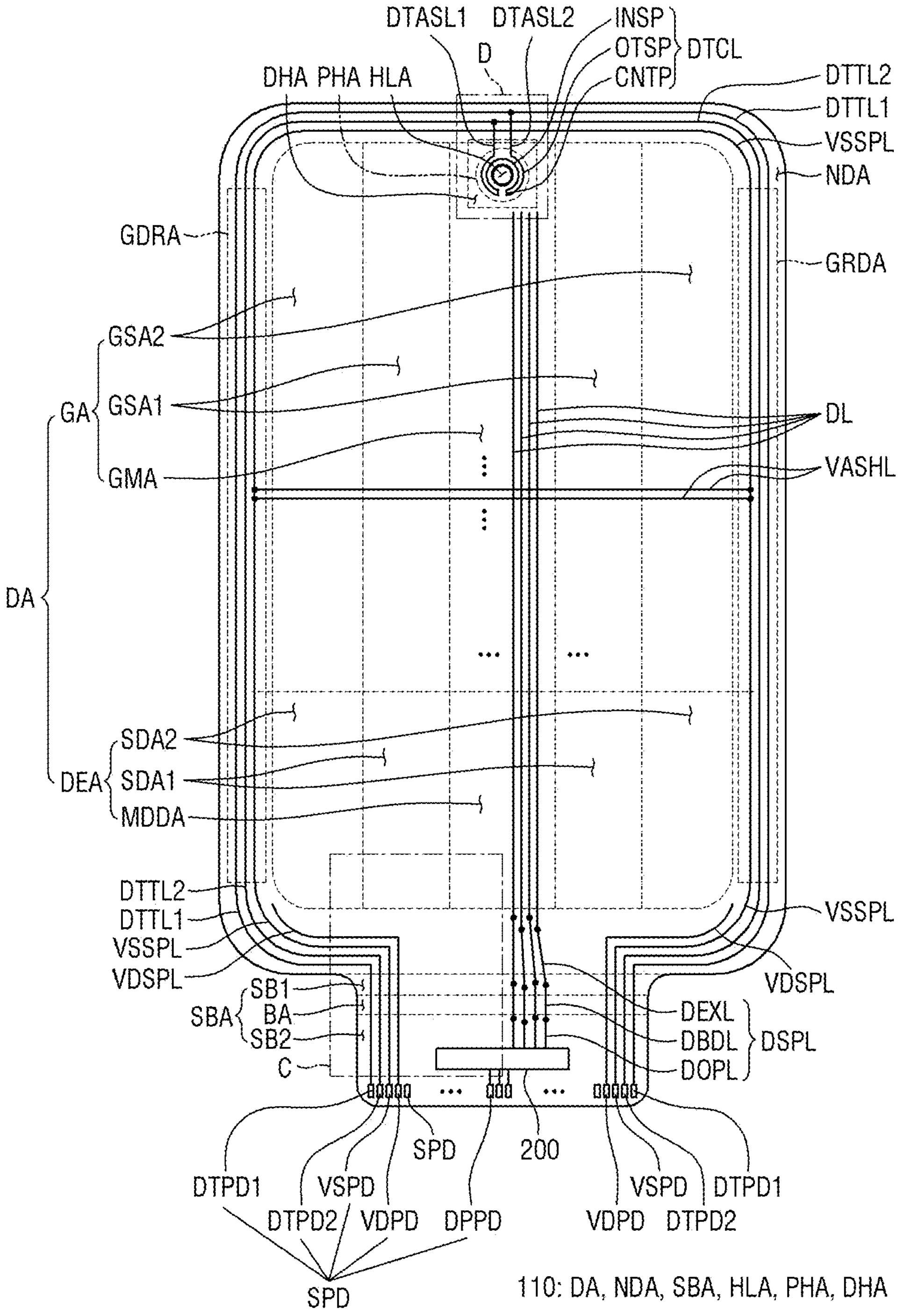
FIG. 7 is a plan view illustrating a first sensing transmission line and a second sensing transmission line according to embodiments.

FIG. 7 is a plan view illustrating a first sensing transmission line and a second sensing transmission line according to embodiments.

Referring to FIG. 7, the substrate 110 of the display device 100 according to embodiments may include a main area MA corresponding to a display surface, a sub-area SBA protruding from a side of the main area MA, a hole area HLA surrounded by the main area MA, and a hole peripheral area PHA disposed between the main area MA and the hole area HLA.

The hole peripheral area PHA may be an area surrounding a periphery of the hole area HLA in a plan view.

The substrate 110 of the display device 100 according to embodiments may further include a hole bypass area DHA disposed between the hole peripheral area PHA and the main area MA.

In the hole bypass area DHA, bypass lines of lines divided by the hole area HLA and the hole peripheral area PHA may be disposed.

According to embodiments, the display area DA may include a bypass area DEA disposed on a side adjacent to the sub-area SBA, and a general area GA disposed in the remaining area excluding the bypass area DEA.

The bypass area DEA may include a bypass middle area MDDA disposed in the center of the first direction DR1, a first bypass side area SDA1 disposed on a side of the bypass middle area MDDA in the first direction DR1, and a second bypass side area SDA2 disposed between the non-display area NDA and the first bypass side area SDA1 in the first direction DR1.

The second bypass side area SDA2 may be disposed closer to an edge of the substrate 110 than the bypass middle area MDDA and the first bypass side area SDA1.

The first bypass side area SDA1 and the second bypass side area SDA2 may be disposed between each side of the bypass middle area MDDA in the first direction DR1 and the non-display area NDA.

The general area GA may include a general middle area GMA connected to the bypass middle area MDDA of the bypass area DEA in the second direction DR2, a first general side area GSA1 connected to the first bypass side area SDA1 of the bypass area DEA in the second direction DR2, and a second general side area GSA2 connected to the second bypass side area SDA2 of the bypass area DEA in the second direction DR2.

The non-display area NDA may include a gate driving circuit area GDRA where a gate driving circuit is disposed.

The gate driving circuit area GDRA may be disposed in a portion of the non-display area NDA adjacent to at least one side of the display area DA in the first direction DR1.

The gate driving circuit in the gate driving circuit area GDRA may sequentially transmit gate signals to gate lines. Gate lines may include a scan write line (GWL in FIG. 5) that transmits a scan write signal (GW in FIG. 5), a scan initialization line (GIL in FIG. 5) that transmits a scan initialization signal (GI in FIG. 5), a gate control line (GCL in FIG. 5) that transmits a gate control signal (GC in FIG. 5), and an emission control line ECL that transmits an emission control signal (EC in FIG. 5).

According to embodiments, the circuit layer 120 may include light emitting pixel drivers EPD electrically connected to the light emitting elements LE of the element layer 130, data lines DL electrically connected to the light emitting pixel drivers EPD, a crack sensing line DTCL disposed in the hole peripheral area PHA, and a first sensing auxiliary line DTASL1 and a second sensing auxiliary line DTASL2 electrically connected to ends of the crack sensing line DTCL, respectively.

The crack sensing line DTCL may extend along the periphery of the hole area HLA.

The shape of the crack sensing line DTCL may include two or more curves that surround the periphery of the hole area HLA one upon another and connection portions connecting the two or more curves.

For example, the crack sensing line DTCL may be arranged in a horseshoe shape including an inner side portion INSP surrounding a periphery of the hole area HLA, an outer side portion OTSP surrounding a periphery of the inner side portion INSP, and connection portions CNTP connecting the inner side portion INSP and the outer side portion OTSP.

The connection portions CNTP of the crack sensing line DTCL may extend in the second direction DR2 in parallel with the data lines DL.

However, the shape of the crack sensing line DTCL is not limited to the embodiment illustrated in FIG. 7, and the shape of the crack sensing line DTCL may be changed to any shape that surrounds the hole area HLA.

The first sensing auxiliary line DTASL1 and the second sensing auxiliary line DTASL2 may extend in the second direction DR2 parallel to the data lines DL, and may be paired with two data lines DL of the data lines DL that cross the hole peripheral area PHA.

According to embodiments, the circuit layer 120 may include a first sensing transmission line DTTL1, a second sensing transmission line DTTL2, a first power transmission line VDSPL, and a second power transmission line VSSPL that are disposed in the non-display area NDA and extend to the sub-area SBA.

The first sensing transmission line DTTL1 and the second sensing transmission line DTTL2 may be electrically connected to the first sensing auxiliary line DTASL1 and the second sensing auxiliary line DTASL2, respectively.

Accordingly, in case that the crack sensing line DTCL is damaged due to a crack extending from the hole peripheral area PHA to the display area DA, resistance of the crack sensing line DTCL increases, which may cause a voltage difference between the first sensing transmission line DTTL1 and the second sensing transmission line DTTL2 to increase. Accordingly, the crack extending from the hole peripheral area PHA to the display area DA may be detected by the voltage difference between the first sensing transmission line DTTL1 and the second sensing transmission line DTTL2.

According to embodiments, each of the first and second sensing transmission lines DTTL1 and DTTL2 may surround a periphery of the display area DA.

At least one of the first sensing transmission line DTTL1 and the second sensing transmission line DTTL2 may be damaged due to a crack extending from an edge of the substrate 110 to the display area DA. Accordingly, the crack extending from the edge of the substrate 110 to the display area DA may also be detected by the voltage difference between the first sensing transmission line DTTL1 and the second sensing transmission line DTTL2.

The first power transmission line VDSPL and the second power transmission line VSSPL may respectively transmit a first power ELVDD and a second power ELVSS for driving the light emitting elements LE.

According to embodiments, the second power transmission line VSSPL may surround the periphery of the display area DA.

As illustrated in FIG. 7, the first power transmission line VDSPL may be disposed in a portion of the non-display area NDA adjacent to the sub-area SBA. However, the arrangement of the first power transmission line VDSPL is not limited to the embodiment in FIG. 7. For example, the first power transmission line VDSPL may surround the periphery of the display area DA.

According to embodiments, the circuit layer 120 may further include first auxiliary lines (ASL1 in FIG. 8) extending in the first direction DR1 crossing the data lines DL.

Power auxiliary horizontal lines VASHL, which are some of the first auxiliary lines ASL1, may be electrically connected to one of the first power transmission line VDSPL and the second power transmission line VSSPL.

For example, as illustrated in FIG. 7, the power auxiliary horizontal lines VASHL may be electrically connected to the second power transmission line VSSPL.

The sub-area SBA may include a bending area BA that is transformed into a bent shape, a first sub-area SB1 disposed between a side of the bending area BA and the main area MA, and a second sub-area SB2 connected to another side of the bending area BA.

In case that the bending area BA is transformed into the bent shape, the second sub-area SB2 may be disposed below the substrate 110 and overlap the main area MA in a plan view.

A display driving circuit 200 may be disposed in the second sub-area SB2.

Signal pads SPD bonded to a circuit board 300 may be disposed at an edge of the second sub-area SB2.

The signal pads SPD may include data pads DPPD electrically connected to the display driving circuit 200, a first power pad VDPD electrically connected to the first power transmission line VDSPL, a second power pad VSPD electrically connected to the second power transmission line VSSPL, a first detection pad DTPD1 electrically connected to the first sensing transmission line DTTL1, and a second detection pad DTPD2 electrically connected to the second sensing transmission line DTTL2.

The display driving circuit 200 of the second sub-area SB2 may be electrically connected to the data lines DL of the display area DA through data supply lines DSPL.

The data supply lines DSPL may be disposed in the non-display area NDA and extend to the sub-area SBA.

For example, each of the data supply lines DSPL may include a data extension line DEXL disposed in the non-display area NDA, extending to the first sub-area SB1, and electrically connected to the data lines DL, a data bending line DBDL disposed in the bending area BA, and a data output line DOPL disposed in the second sub-area SB2 and electrically connected to the display driving circuit 200.

Figure 8:
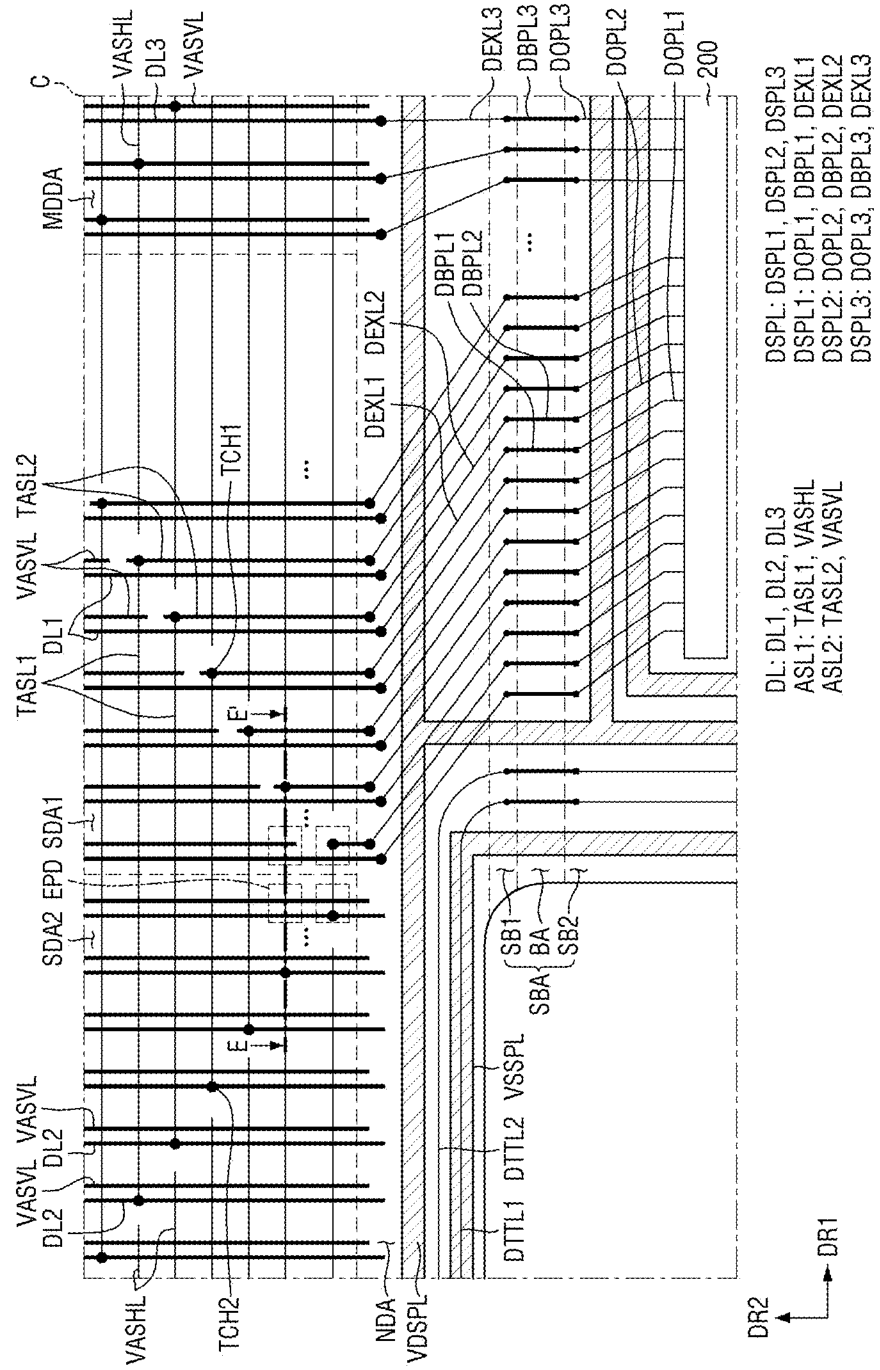
FIG. 8 is a plan view of portion C of FIG. 7.
Figure 9:
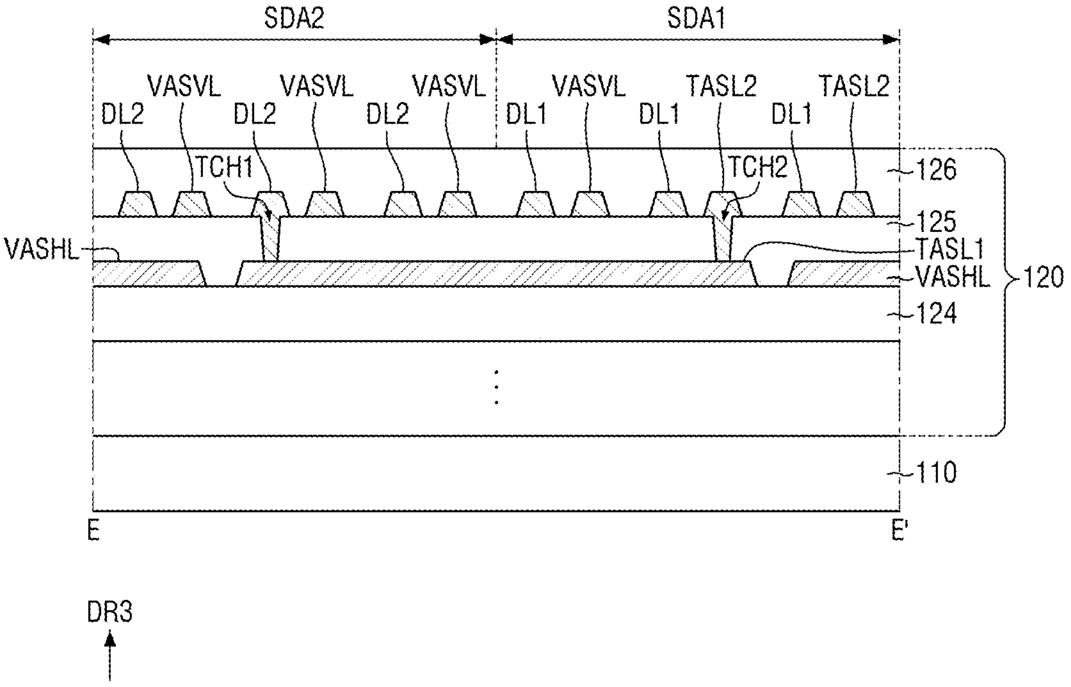
FIG. 9 is a schematic cross-sectional view taken along line E-E' of FIG. 8.

FIG. 8 is a plan view of portion C of FIG. 7. FIG. 9 is a schematic cross-sectional view taken along line E-E' of FIG. 8.

Referring to FIG. 8, the circuit layer 120 of the display device 100 according to embodiments may include light emitting pixel drivers EPD each electrically connected to the light emitting elements LE of the element layer 130, data lines DL electrically connected to the light emitting pixel drivers EPD and transmitting a data signal Vdata, first auxiliary lines ASL1 extending in the first direction DR1 crossing the data lines DL, and second auxiliary lines ASL2 extending in parallel with the data lines DL and paired with the data lines DL, respectively.

The data lines DL and the second auxiliary lines ASL2 may extend in the second direction DR2.

According to embodiments, the first auxiliary lines ASL1 may overlap the pixel drivers EPD of the display area DA in a plan view. For example, the number of first auxiliary lines ASL1 may be the number of columns of the light emitting areas EA in the first direction DR1.

The data lines DL may include a first data line DL1 disposed in the first bypass side area SDA1 and a second data line DL2 disposed in the second bypass side area SDA2.

The first auxiliary lines ASL1 may include a first bypass auxiliary line TASL1 electrically connected to the second data line DL2 of the second bypass side area SDA2.

The second auxiliary lines ASL2 may include a second bypass auxiliary line TASL2 paired with the first data line DL1 of the first bypass side area SDA1 and electrically connected to the first bypass auxiliary line TASL1.

The data supply lines DSPL may include a first data supply line DSPL1 that transmits a data signal of the first data line DL1, and a second data supply line DSPL2 that transmits a data signal of the second data line DL2.

According to embodiments, the data supply lines DSPL may extend to the first bypass side area SDA1 and the bypass middle area MDDA.

Accordingly, the first data supply line DSPL1 may extend to the first bypass side area SDA1 and may be electrically connected (e.g., directly electrically connected) to the first data line DL1.

On the other hand, the second data supply line DSPL2 may extend to the second bypass auxiliary line TASL2 of the first bypass side area SDA1, and may be electrically connected to the second data line DL2 through the second bypass auxiliary line TASL2 and the first bypass auxiliary line TASL1.

In this way, since the second data supply line DSPL2 extends not to the second data line DL2 of the second bypass side area SDA2, but to the second bypass auxiliary line TASL2 of the first bypass side area SDA1, an extension length of the second data supply line DSPL2 may be shortened. As a result, a width of the area required for arrangement of the data supply lines DSPL may be reduced, and thus a width of the non-display area NDA may be reduced.

Since the data supply lines DSPL are not disposed in some areas of the non-display area NDA disposed between the bent edge of the substrate 110 and the second bypass side area SDA2, the width of the non-display area NDA may be further reduced.

The data lines DL may further include a third data line DL3 disposed in the bypass middle area MDDA. The data supply lines DSPL may further include a third data supply line DSPL3 that transmits a data signal of the third data line DL3.

The third data supply line DSPL3 may extend to the bypass middle area MDDA and may be electrically connected (e.g., directly electrically connected) to the third data line DL3.

The first bypass auxiliary line TASL1 may extend from the second bypass auxiliary line TASL2 to the second data line DL2.

The second bypass auxiliary line TASL2 may extend from the second data supply line DSPL2 in the non-display area NDA to the first bypass auxiliary line TASL1.

In this way, as the first bypass auxiliary line TASL1 and the second bypass auxiliary line TASL2 are limitedly arranged in the bypass area DEA, ends of the first bypass auxiliary line TASL1 and ends of the second bypass auxiliary line TASL2 may be arranged regularly. As a result, the visibility of the first bypass auxiliary line TASL1 and the second bypass auxiliary line TASL2 may be increased.

To prevent such a problem, the first auxiliary lines ASL1 may further include power auxiliary horizontal lines VASHL in addition to the first bypass auxiliary line TASL1.

The second auxiliary lines ASL2 may further include power auxiliary vertical lines VASVL in addition to the second bypass auxiliary line TASL2.

The power auxiliary horizontal lines VASHL may be electrically connected to one of the first power transmission line VDSPL and the second power transmission line VSSPL.

The power auxiliary vertical lines VASVL may be electrically connected to the power auxiliary horizontal lines VASHL through power auxiliary connection holes disposed in the general area GA and the bypass middle area MDDA.

Two of the power auxiliary horizontal lines VASHL may extend from ends of the first bypass auxiliary line TASL1 to the non-display area NDA.

One of the power auxiliary vertical lines VASVL may extend from an end of the second bypass auxiliary line TASL2 to the non-display area NDA in a direction away from the sub-area SBA.

Accordingly, each of the first data lines DL1 may include a portion paired with the second bypass auxiliary line TASL2, and a portion paired with a power auxiliary vertical line VASVL extending from an end of the second bypass auxiliary line TASL2.

Since the second bypass auxiliary line TASL2 is disposed only in the first bypass side area SDA1, each of the second data line DL2 of the second bypass side area SDA2 and the third data line DL3 of the bypass middle area MDDA may be paired with the power auxiliary vertical line VASVL.

The first bypass auxiliary line TASL1 among the first auxiliary lines ASL1 may be disposed in a portion of each of the first bypass side area SDA1 and the second bypass side area SDA2 adjacent to a boundary between the first bypass side area SDA1 and the second bypass side area SDA2 of the bypass area DEA. The power auxiliary horizontal lines VASHL among the first auxiliary lines ASL1 may be disposed in a portion of the first bypass side area SDA1 adjacent to the bypass middle area MDDA, a portion of each second bypass side area SDA2 adjacent to the non-display area NDA, and the bypass middle area MDDA.

In the general area GA, the power auxiliary horizontal lines VASHL and the power auxiliary vertical lines VASVL may be disposed.

Referring to FIG. 9, the data lines DL and the second auxiliary lines ASL2 may be disposed on the first planarization layer 125 covering the first auxiliary lines ASL1.

For example, the first auxiliary lines ASL1 may be disposed in the first source/drain conductive layer on the interlayer insulating layer 124.

The data line DL and the second auxiliary lines ASL2 may be disposed in the second source/drain conductive layer on the first planarization layer 125.

The second data line DL2 may be electrically connected to the first bypass auxiliary line TASL1 through a first bypass connection hole TCH1 penetrating through the first planarization layer 125.

The second bypass auxiliary line TASL2 may be electrically connected to the first bypass auxiliary line TASL1 through a second bypass connection hole TCH2 penetrating through the first planarization layer 125.

Figure 10:
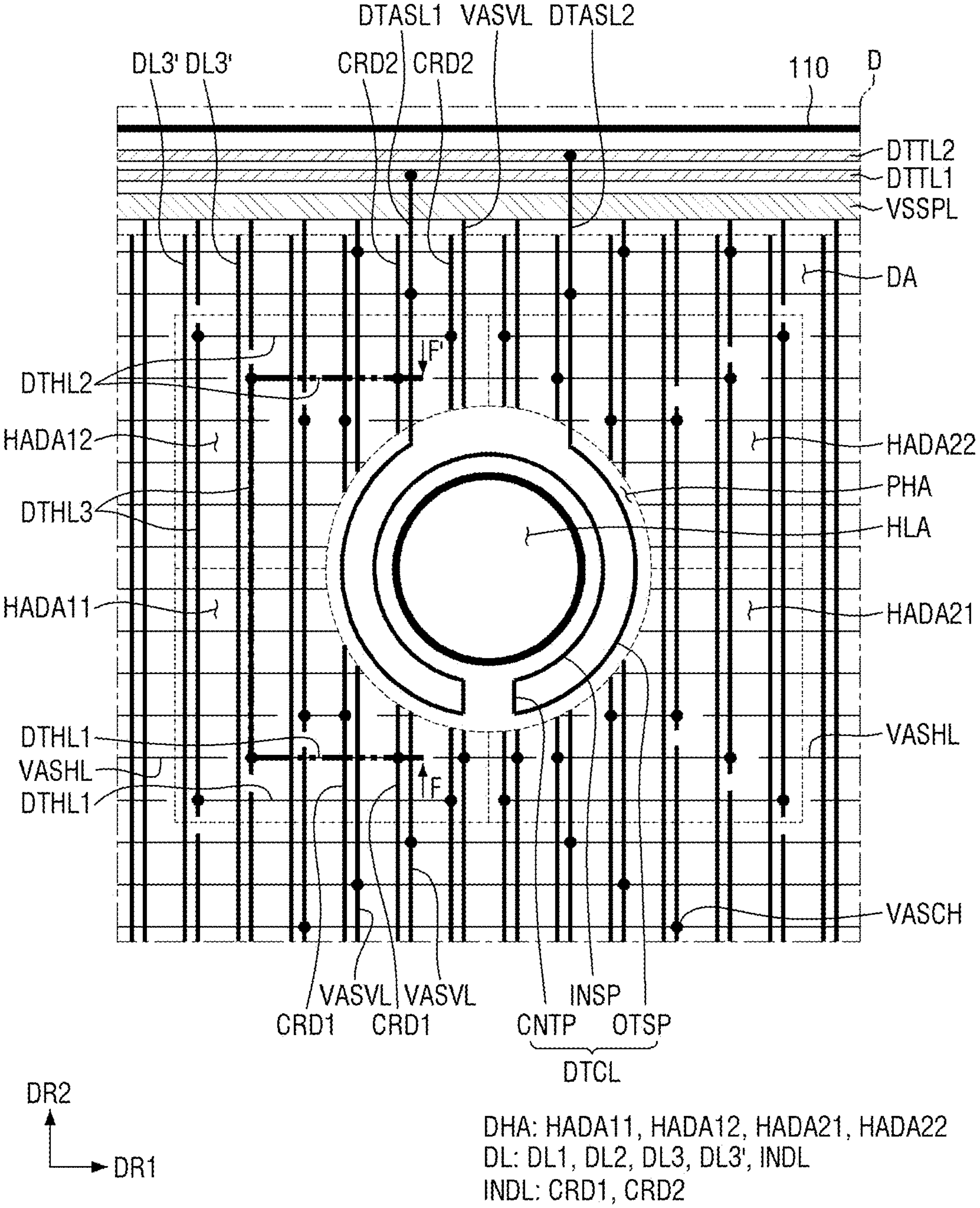
FIG. 10 is a plan view of portion D of FIG. 7 according to an embodiment.
Figure 11:
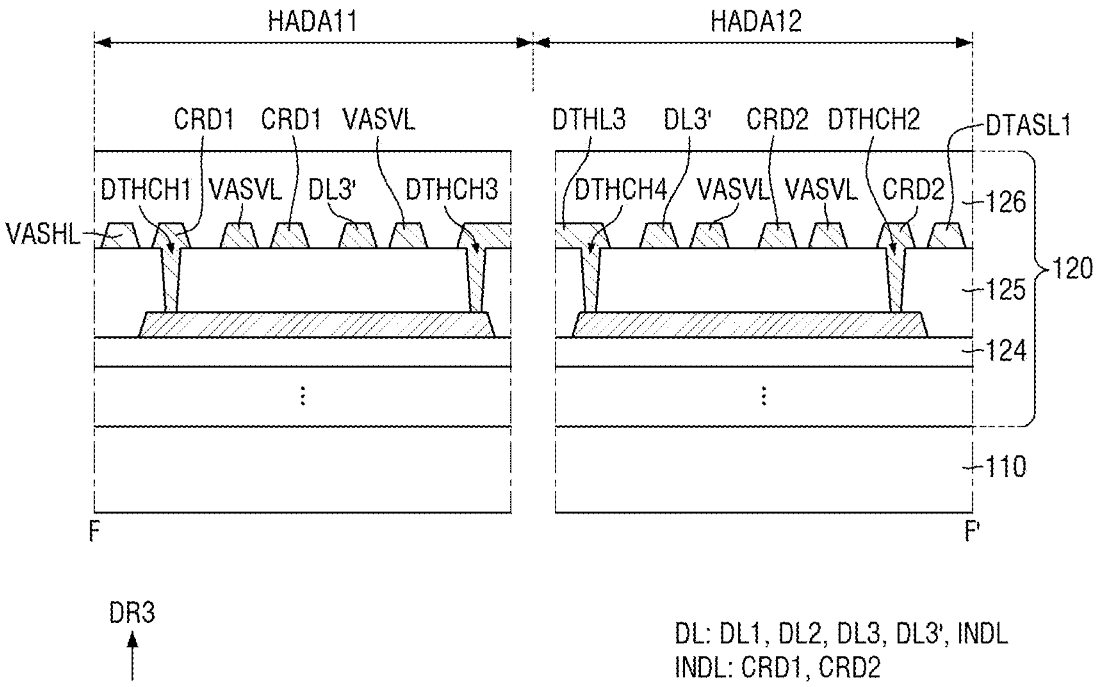
FIG. 11 is a schematic cross-sectional view taken along line F-F' of FIG. 10.

FIG. 10 is a plan view of portion D of FIG. 7 according to an embodiment. FIG. 11 is a schematic cross-sectional view taken along line F-F' of FIG. 10.

Referring to FIG. 10, the circuit layer 120 according to embodiments may include a crack sensing line DTCL disposed in the hole peripheral area PHA and extending along the periphery of the hole area HLA.

Due to a perforation process performed on the hole area HLA, a crack may occur in a portion of the hole peripheral area PHA adjacent to the hole area HLA. The crack in the hole peripheral area PHA may gradually extend into the display area DA.

In case that the crack sensing line DTCL is damaged by the crack extending from the hole peripheral area PHA to the display area DA, resistance of the crack sensing line DTCL may increase, which may cause a voltage difference across the crack sensing line DTCT to be increased. Accordingly, the crack extending from the hole peripheral area PHA to the display area DA may be detected.

The crack sensing line DTCL may be arranged in a horseshoe shape including an inner side portion INSP of a curve adjacent to an edge of the hole area HLA, an outer side portion OTSP surrounding a periphery of the inner side portion INSP, and connection portions CNTP of a straight line connecting the inner side portion INSP and the outer side portion OTSP.

However, the disclosure is not limited thereto, and the shape of the crack sensing line DTCL may be changed as much as desired under the condition that it surrounds the periphery of the hole area HLA.

Since a penetrating portion (not illustrated) that penetrates through at least the substrate 110 and the circuit layer 120 is disposed in the hole area HLA, a hole cross data line INDL that crosses the hole peripheral area PHA among the data lines DL of the circuit layer 120 may be divided by the penetrating portion of the hole area HLA and the hole peripheral area PHA.

For example, the hole cross data line INDL may include a first cross division portion CRD1 adjacent to the sub-area SBA and disposed between the non-display area NDA and a side of the hole area HLA, and a second cross division portion CRD2 spaced apart from the first cross division portion CRD1 and disposed between another side of the hole area HLA and the non-display area NDA.

The first cross division portion CRD1, which is a portion relatively more adjacent to the sub-area SBA, may be electrically connected to the data supply line DSPL.

The second cross division portion CRD2 may be spaced apart from the first cross division portion CRD1 by the hole area HLA and the hole peripheral area PHA.

Accordingly, the circuit layer 120 may include hole bypass lines DTHL1, DTHL2, and DTHL3 for electrical connection between the first cross division portion CRD1 and the second cross division portion CRD2.

The hole bypass lines DTHL1, DTHL2, and DTHL3 may be provided as some of the first auxiliary lines ASL1 and some of the second auxiliary lines ASL2 disposed in the hole bypass area DHA between the hole peripheral area PHA and the main area MA.

For example, the first auxiliary lines ASL1 extending in the first direction DR1 may include a first hole bypass line DTHL1 electrically connected to the first cross division portion CRD1 and a second hole bypass line DTHL2 electrically connected to the second cross division portion CRD2.

The second auxiliary lines ASL2 extending in the second direction DR2 may include a third hole bypass line DTHL3 electrically connecting the first hole bypass line DTHL1 and the second hole bypass line DTHL2.

In other words, the hole bypass area DHA may be separated by an imaginary line in the first direction DR1 and an imaginary line in the second direction DR2 based on a midpoint of the hole area HLA.

For example, the hole bypass area DHA may include a first hole adjacent area HADA11 and a second hole adjacent area HADA12 adjacent to a side (left side in FIG. 10) of the hole area HLA in the first direction DR1 and adjacent to each other in the second direction DR2, and a third hole adjacent area HADA21 and a fourth hole adjacent area HADA22 adjacent to another side (right side in FIG. 10) of the hole area HLA in the first direction DR1 and adjacent to each other in the second direction DR2. The third hole adjacent area HADA21 may be adjacent to the first hole adjacent area HADA11 in the first direction DR1, and the fourth hole adjacent area HADA22 may be adjacent to the second hole adjacent area HADA12 in the first direction DR1.

In the case of the hole cross data line INDL crossing a side of the hole area HLA and the hole peripheral area PHA in the second direction DR2, the first cross division portion CRD1 may be disposed in the first hole adjacent area HADA11, and the second cross division portion CRD2 may be disposed in the second hole adjacent area HADA12. Accordingly, the second cross division portion CRD2 may be electrically connected to the first cross division portion CRD1 through the second hole bypass line DTHL2 disposed in the second hole adjacent area HADA12, the third hole bypass line DTHL3 extending from the second hole adjacent area HADA12 to the first hole adjacent area HADA11, and the first hole bypass line DTHL1 disposed in the first hole adjacent area HADA11.

Referring to FIG. 11, the first hole bypass line DTHL1 may be electrically connected to the first cross division portion CRD1 through a first hole bypass connection hole DTHCH1, and the second hole bypass line DTHL2 may be electrically connected to the second cross division portion CRD2 through a second hole bypass connection hole DTHCH2. The third hole bypass line DTHL3 may be electrically connected to the first hole bypass line DTHL1 through a third hole bypass connection hole DTHCH3, and may be electrically connected to the second hole bypass line DTHL2 through a fourth hole bypass connection hole DTHCH4.

The first hole bypass connection hole DTHCH1, the second hole bypass connection hole DTHCH2, the third hole bypass connection hole DTHCH3, and the fourth hole bypass connection hole DTHCH4 may each penetrate through the first planarization layer 125.

As illustrated in FIG. 10, in the case of the hole cross data line INDL crossing the another side of the hole area HLA and the hole peripheral area PHA in the second direction DR2, the first cross division portion CRD1 may be disposed in the third hole adjacent area HADA21, and the second cross division portion CRD2 may be disposed in the fourth hole adjacent area HADA22. The first cross division portion CRD1 of the third hole adjacent area HADA21 and the second cross division portion CRD2 of the fourth hole adjacent area HADA22 may be electrically connected to each other through the second hole bypass line DTHL2 disposed in the fourth hole adjacent area HADA22, the third hole bypass line DTHL3 extending from the fourth hole adjacent area HADA22 to the third hole adjacent area HADA21, and the first hole bypass line DTHL1 disposed in the third hole adjacent area HADA21.

Some of the power auxiliary horizontal lines VASHL may be parallel to ends of the first hole bypass line DTHL1 and the second hole bypass line DTHL2, respectively, and may be spaced apart from ends of the first hole bypass line DTHL1 and the second hole bypass line DTHL2, respectively.

Some of the power auxiliary vertical lines VASVL may be parallel to ends of the third hole bypass line DTHL3 and may be spaced apart from ends of the third hole bypass line DTHL3.

The power auxiliary vertical lines VASVL may be electrically connected to the power auxiliary horizontal lines VASHL through power auxiliary connection holes VASCH.

The power auxiliary connection holes VASCH may be arranged side by side in a diagonal direction.

The third hole bypass line DTHL3 may be paired with a data line DL3' disposed in the hole bypass area DHA.

FIGS. 7 and 10 illustrate an embodiment in which the hole area HLA and the hole peripheral area PHA are disposed in the general middle area GMA of the main area MA. However, the disclosure is not limited thereto, and the hole area HLA and the hole peripheral area PHA may be disposed anywhere in the main area MA.

According to embodiments, the second auxiliary line ASL2 may include a first sensing auxiliary line DTASL1 and a second sensing auxiliary line DTASL2 respectively electrically connected to ends of the crack sensing line DTCL.

The first sensing auxiliary line DTASL1 and the second sensing auxiliary line DTASL2 may be paired with two hole cross data lines INDL that cross the hole peripheral area PHA.

The first sensing auxiliary line DTASL1 may be electrically connected to the first sensing transmission line DTTL1 in the non-display area NDA.

The second sensing auxiliary line DTASL2 may be electrically connected to the second sensing transmission line DTTL2 in the non-display area NDA.

According to embodiments, each of the first sensing transmission line DTTL1 and the second sensing transmission line DTTL2 may be disposed in the non-display area NDA in a form surrounding the periphery of the display area DA.

Each of the first sensing auxiliary line DTASL1 and the second sensing auxiliary line DTASL2 may extend from a portion of the non-display area NDA that is far away from the sub-area SBA to a side of the hole peripheral area PHA opposite to the sub-area SBA.

In other words, the first sensing auxiliary line DTASL1 may be paired with the second cross division portion CRD2 of a hole cross data line INDL, and the second sensing auxiliary line DTASL2 may be paired with the second cross division portion CRD2 of another hole cross data line INDL.

For example, each of the first sensing auxiliary line DTASL1 and the second sensing auxiliary line DTASL2 may extend from the second hole adjacent area HADA12 or the fourth hole adjacent area HADA22 to the non-display area NDA.

As described above, according to the embodiments, the first sensing auxiliary line DTASL1 and the second sensing auxiliary line DTASL2 electrically connecting between the first and second sensing transmission lines DTTL1 and DTTL2 and ends of the crack sensing line DTCL may not be provided as separate conductive layers, but may be provided as some of the second auxiliary lines ASL2 that are each paired with the data lines DL and include the second bypass auxiliary line TASL2.

In this way, a separate mask process for preparing the first sensing auxiliary line DTASL1 and the second sensing auxiliary line DTASL2 may be eliminated.

The first sensing auxiliary line DTASL1 and the second sensing auxiliary line DTASL2 may be covered with the second planarization layer 126 covering the data lines, together with the data lines DL, as a portion of the circuit layer 120. Accordingly, damage to the first sensing auxiliary line DTASL1 and the second sensing auxiliary line DTASL2 may be prevented, and thus the reliability of crack sensing using the crack sensing line DTCL may be improved.

According to embodiments, the crack sensing line DTCL, the first sensing auxiliary line DTASL1, and the second sensing auxiliary line DTASL2 may be disposed on a same layer. For example, the crack sensing line DTCL may be disposed in the second source/drain conductive layer on the first planarization layer 125.

Accordingly, there is an advantage that the electrical connection between the first and second sensing auxiliary lines DTASL1 and DTASL2 and ends of the crack sensing line DTCL may be implemented without the contact holes.

Since the crack sensing line DTCL is provided as a portion of the circuit layer 120, there is an advantage that the crack transmitted to the circuit layer 120 may be readily sensed.

As illustrated in FIG. 10, according to an embodiment, in the first direction DR1 crossing the data lines DL, two or more data lines DL may be disposed between the first sensing auxiliary line DTASL1 and the second sensing auxiliary line DTASL2.

For example, in the first direction DR1 crossing the data lines DL, the second cross division portions CRD2 of two or more hole cross data lines INDL may be disposed between the first sensing auxiliary line DTASL1 and the second sensing auxiliary line DTASL2.

Figure 12:
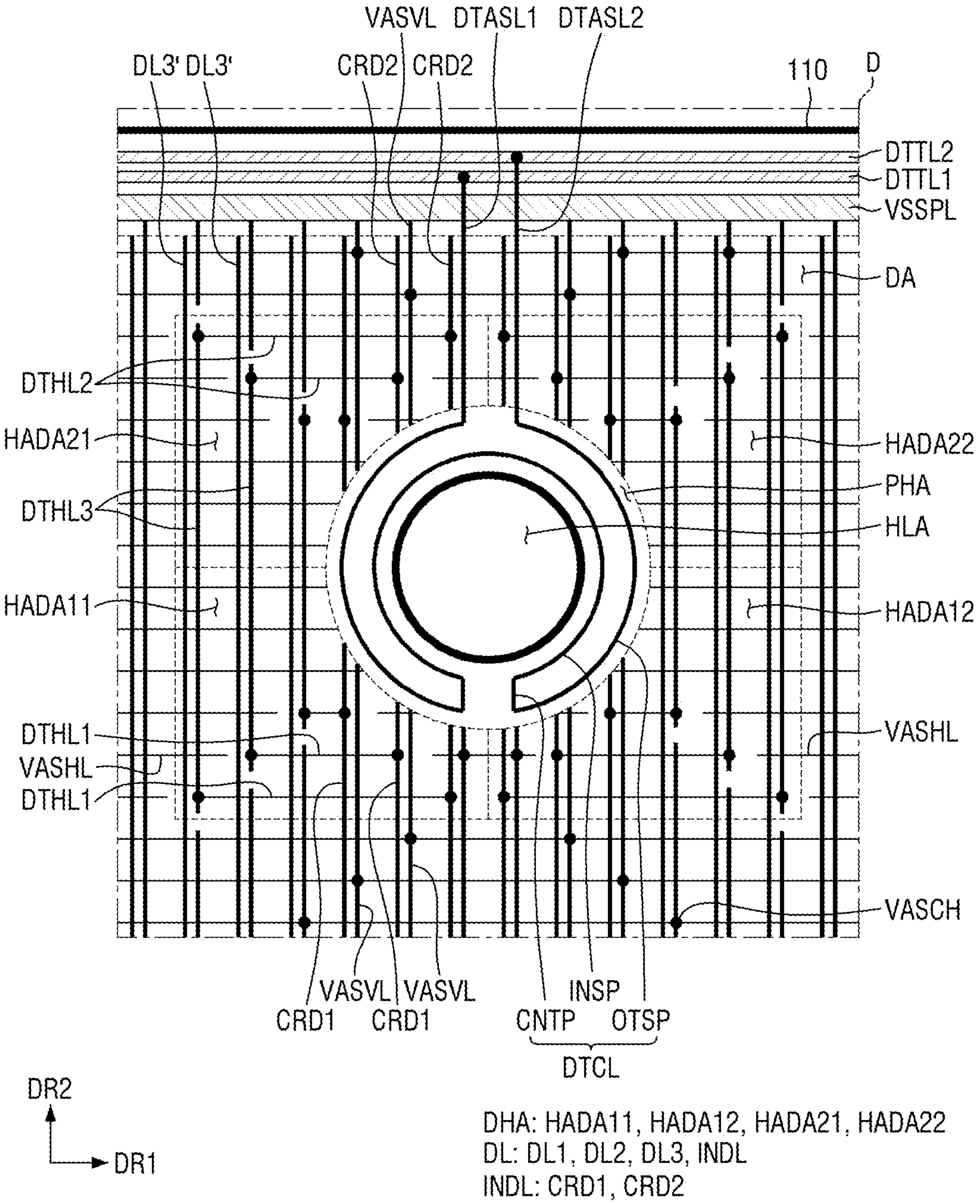
FIG. 12 is a plan view of portion D of FIG. 7 according to an embodiment.

FIG. 12 is a plan view of portion D of FIG. 7 according to an embodiment.

Referring to FIG. 12, a display device 100 according to an embodiment may be substantially the same as the display device according to the embodiments illustrated in FIGS. 10 and 11, except that one data line DL may be disposed between the first sensing auxiliary line DTASL1 and the second sensing auxiliary line DTASL2 in the first direction DR1 crossing the data lines DL, and thus redundant descriptions are omitted below.

As illustrated in FIG. 12, according to an embodiment, a hole cross data line INDL paired with the first sensing auxiliary line DTASL1 and another hole cross data line INDL paired with the second sensing auxiliary line DTASL2 may be disposed between the first sensing auxiliary line DTASL1 and the second sensing auxiliary line DTASL2 in the first direction DR1 crossing the data lines DL.

In this way, since a distance between ends of the crack sensing line DTCL electrically connected to the first sensing auxiliary line DTASL1 and the second sensing auxiliary line DTASL2 is relatively small, the extension length of the crack sensing line DTCL may be relatively long. As a result, a crack sensing range by the crack sensing line DTCL may be relatively widened.

Figure 13:
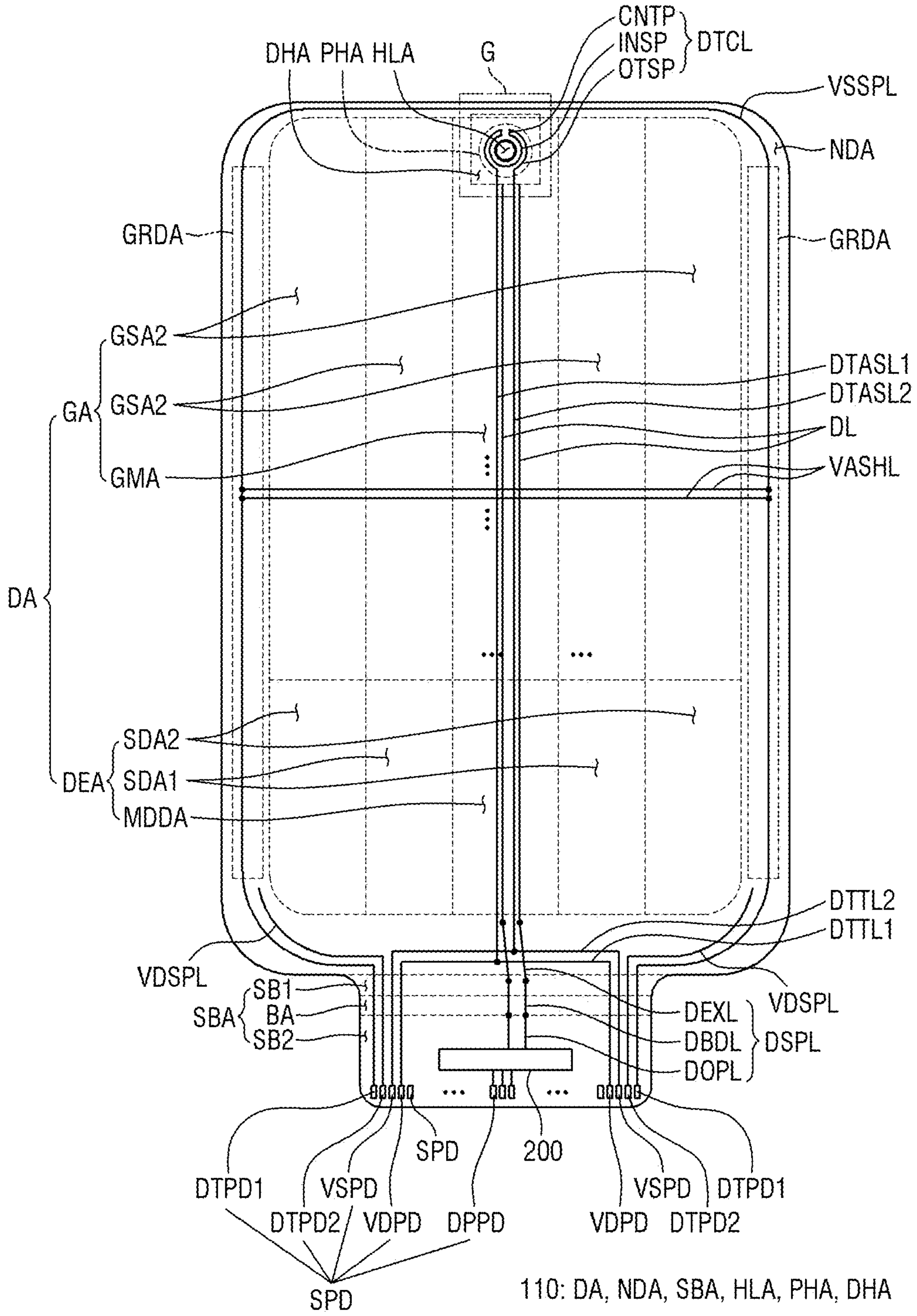
FIG. 13 is a plan view illustrating a first sensing transmission line and a second sensing transmission line according to embodiments.
Figure 14:
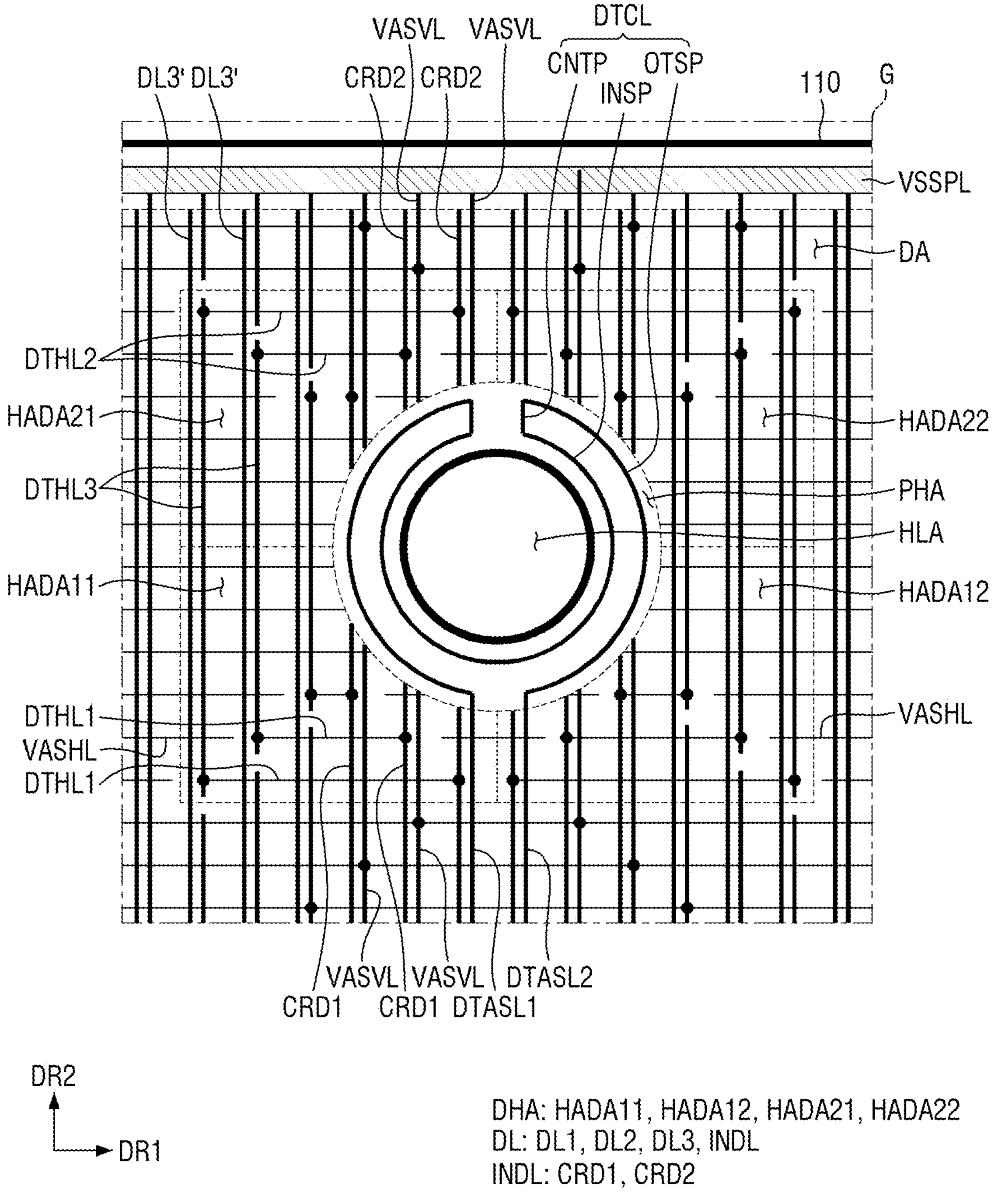
FIG. 14 is a plan view of portion G of FIG. 13.

FIG. 13 is a plan view illustrating a first sensing transmission line and a second sensing transmission line according to embodiments. FIG. 14 is a plan view of portion G of FIG. 13.

Referring to FIGS. 13 and 14, a display device 100 according to an embodiment may be substantially the same as the display devices according to the embodiments illustrated in FIGS. 10 and 11 and the embodiment illustrated in FIG. 12, except that the first sensing transmission line DTTL1 and the second sensing transmission line DTTL2 may be disposed in a portion of the non-display area NDA adjacent to the sub-area SBA, and the first sensing auxiliary line DTASL1 and the second sensing auxiliary line DTASL2 may extend from a portion of the non-display area NDA adjacent to the sub-area SBA to a side of the hole peripheral area PHA facing the sub-area SBA, and thus redundant descriptions are omitted below.

As illustrated in FIGS. 13 and 14, according to an embodiment, each of the first sensing auxiliary line DTASL1 and the second sensing auxiliary line DTASL2 may extend from the bypass area DEA to the first hole adjacent area HADA11 or the third hole adjacent area HADA21.

In this way, since the first sensing transmission line DTTL1 and the second sensing transmission line DTTL2 are not disposed in the non-display area NDA in a form surrounding the periphery of the display area DA, but are disposed only in a portion of the non-display area NDA adjacent to the sub-area SBA, the width of the non-display area NDA may be reduced.

As the first sensing auxiliary line DTASL1 and the second sensing auxiliary line DTASL2 are provided as portions of the second auxiliary lines ASL2, electrical connection between the first and second sensing auxiliary lines DTASL1 and DTASL2 and ends of the crack sensing line DTCL may be relatively readily implemented, even in case that the first sensing transmission line DTTL1 and the second sensing transmission line DTTL2 are disposed only in a portion of the non-display area NDA adjacent to the sub-area SBA.

The above description is an example of technical features of the disclosure, and those skilled in the art to which the disclosure pertains will be able to make various modifications and variations. Therefore, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. A display device comprising:
a circuit layer disposed on a substrate; and
an element layer disposed on the circuit layer, wherein
the substrate includes:
a main area including a display area in which light emitting areas are arranged and a non-display area arranged adjacent to the display area;
a sub-area protruding from a side of the main area;
a hole area surrounded by the main area; and
a hole peripheral area disposed between the main area and the hole peripheral area,
the element layer includes light emitting elements disposed in the light emitting areas, respectively, and
the circuit layer includes:
light emitting pixel drivers electrically connected to the light emitting elements, respectively;
data lines electrically connected to the light emitting pixel drivers;
a crack sensing line disposed in the hole peripheral area; and
a first sensing auxiliary line and a second sensing auxiliary line extending in parallel with the data lines, paired with two of the data lines crossing the hole peripheral area, respectively, and electrically connected to ends of the crack sensing line, respectively.

2. The display device of claim 1, wherein two or more of the data lines are disposed between the first sensing auxiliary line and the second sensing auxiliary line in a direction crossing the data lines.

3. The display device of claim 1, wherein one of the data lines and another one of the data lines are disposed between the first sensing auxiliary line and the second sensing auxiliary line in a direction crossing the data lines.

4. The display device of claim 1, wherein
the circuit layer further includes a first sensing transmission line and a second sensing transmission line disposed in the non-display area, extending to the sub-area, and electrically connected to the first sensing auxiliary line and the second sensing auxiliary line, respectively,
the first sensing auxiliary line extends from the first sensing transmission line to an end of the crack sensing line, and
the second sensing auxiliary line extends from the second sensing transmission line to another end of the crack sensing line.

5. The display device of claim 4, wherein
each of the first sensing transmission line and the second sensing transmission line surrounds a periphery of the display area, and
each of the first sensing auxiliary line and the second sensing auxiliary line extends from a portion of the non-display area that is spaced apart from the sub-area to a side of the hole peripheral area opposite to the sub-area.

6. The display device of claim 4, wherein
each of the first sensing transmission line and the second sensing transmission line is disposed in a portion of the non-display area adjacent to the sub-area, and
each of the first sensing auxiliary line and the second sensing auxiliary line extends from a portion of the non-display area adjacent to the sub-area to a side of the hole peripheral area facing the sub-area.

7. The display device of claim 4, wherein
the circuit layer further includes:
first auxiliary lines extending in a first direction crossing the data lines and overlapping the light emitting pixel drivers in a plan view; and
second auxiliary lines extending in parallel with the data lines, paired with the data lines, respectively, and including the first sensing auxiliary line and the second sensing auxiliary line, and
the data lines and the second auxiliary lines are disposed on at least one insulating layer covering the first auxiliary lines.

8. The display device of claim 7, wherein
the first auxiliary lines include a first bypass auxiliary line electrically connected to a first data line of the data lines adjacent to the non-display area in the first direction, and
the second auxiliary lines further include a second bypass auxiliary line paired with a second data line of the data lines spaced farther from the non-display area than the first data line in the first direction and electrically connected to the first bypass auxiliary line.

9. The display device of claim 8, further comprising:
a display driving circuit transmitting data signals of the light emitting pixel drivers to the data lines, wherein
the circuit layer further includes data supply lines disposed in the non-display area and electrically connected between the data lines and the display driving circuit,
the substrate further includes a bypass area disposed on a side of the display area and including a bypass middle area at a center, a first bypass side area that is parallel to the bypass middle area in the first direction and is in contact with the non-display area, and a second bypass side area disposed between the bypass middle area and the first bypass side area,
the first data line is disposed in the first bypass side area,
the second data line is disposed in the second bypass side area,
a first data supply line of the data supply lines transmitting a data signal of the first data line is electrically connected to the first data line through the first bypass auxiliary line and the second bypass auxiliary line, and
a second data supply line of the data supply lines transmitting a data signal of the second data line is directly electrically connected to the second data line.

10. The display device of claim 8, wherein
the substrate further includes a hole bypass area disposed between the hole peripheral area and the main area,
the data lines include hole cross data lines that cross the hole area or the hole peripheral area,
the hole cross data line includes:
a first cross division portion adjacent to the sub-area and disposed between the non-display area and a side of the hole area; and
a second cross division portion disposed between another side of the hole area and the non-display area,
the first auxiliary lines further include:

a first hole bypass line electrically connected to the first cross division portion; and a second hole bypass line electrically connected to the second cross division portion, and the second auxiliary lines further include a third hole bypass line electrically connecting the first hole bypass line and the second hole bypass line.

11. The display device of claim 10, wherein the circuit layer further includes a first power supply line and a second power supply line disposed in the non-display area and transmitting a first power and a second power for driving the light emitting elements, respectively, the first auxiliary lines further include power auxiliary horizontal lines other than the first bypass auxiliary line, the first hole bypass line, and the second hole bypass line, the second auxiliary lines further include power auxiliary vertical lines other than the first sensing auxiliary line, the second sensing auxiliary line, the second bypass auxiliary line, and the third hole bypass line, and the power auxiliary horizontal lines and the power auxiliary vertical lines are electrically connected to one of the first power supply line and the second power supply line.

12. The display device of claim 1, wherein the crack sensing line is arranged in a horseshoe shape in a plan view including an inner side portion surrounding a periphery of the hole area, an outer side portion surrounding a periphery of the inner side portion, and connection portions connecting the inner side portion and the outer side portion.

13. A display device comprising:

a circuit layer disposed on a substrate; and an element layer disposed on the circuit layer, wherein the substrate includes:

a main area including a display area in which light emitting areas are arranged and a non-display area arranged adjacent to the display area;

a sub-area protruding from a side of the main area;

a hole area surrounded by the main area; and a hole peripheral area disposed between the main area and the hole peripheral area, the element layer includes light emitting elements disposed in the light emitting areas, respectively, and the circuit layer further includes:

light emitting pixel drivers electrically connected to the light emitting elements, respectively;

data lines electrically connected to the light emitting pixel drivers;

first auxiliary lines extending in a first direction crossing the data lines and overlapping the light emitting pixel drivers in a plan view;

second auxiliary lines extending in parallel with the data lines and paired with the data lines, respectively; and a crack sensing line disposed in the hole peripheral area, and the second auxiliary lines include a first sensing auxiliary line and a second sensing auxiliary line paired with two of the data lines crossing the hole peripheral area, respectively, and electrically connected to ends of the crack sensing line, respectively.

14. The display device of claim 13, wherein two or more of the data lines are disposed between the first sensing auxiliary line and the second sensing auxiliary line in a direction crossing the data lines.

15. The display device of claim 13, wherein one of the data lines and another one of the data lines are disposed between the first sensing auxiliary line and the second sensing auxiliary line in a direction crossing the data lines.

16. The display device of claim 13, wherein the circuit layer further includes a first sensing transmission line and a second sensing transmission line disposed in the non-display area, extending to the sub-area, and electrically connected to the first sensing auxiliary line and the second sensing auxiliary line, respectively, the first sensing auxiliary line extends from the first sensing transmission line to an end of the crack sensing line, and the second sensing auxiliary line extends from the second sensing transmission line to another end of the crack sensing line.

17. The display device of claim 16, wherein each of the first sensing transmission line and the second sensing transmission line surrounds the display area, and each of the first sensing auxiliary line and the second sensing auxiliary line extends from a portion of the non-display area that is spaced apart from the sub-area to a side of the hole peripheral area opposite to the sub-area.

18. The display device of claim 16, wherein each of the first sensing transmission line and the second sensing transmission line is disposed in a portion of the non-display area adjacent to the sub-area, and each of the first sensing auxiliary line and the second sensing auxiliary line extends from a portion of the non-display area adjacent to the sub-area to a side of the hole peripheral area facing the sub-area.

19. The display device of claim 16, further comprising:

a display driving circuit transmitting data signals of the light emitting pixel drivers to the data lines, wherein the circuit layer further includes data supply lines disposed in the non-display area and electrically connected between the data lines and the display driving circuit, the substrate further includes a bypass area disposed on a side of the display area and including a bypass middle area at a center, a first bypass side area that is parallel to the bypass middle area in the first direction and is in contact with the non-display area, and a second bypass side area disposed between the bypass middle area and the first bypass side area, the first auxiliary lines include a first bypass auxiliary line electrically connected to a first data line of the data lines disposed in the first bypass side area, the second auxiliary lines further include a second bypass auxiliary line paired with a second data line of the data lines disposed in the second bypass side area and electrically connected to the first bypass auxiliary line, a first data supply line of the data supply lines transmitting a data signal of the first data line is electrically connected to the first data line through the first bypass auxiliary line and the second bypass auxiliary line, and a second data supply line of the data supply lines transmitting a data signal of the second data line is directly electrically connected to the second data line.

20. The display device of claim 19, wherein the substrate further includes a hole bypass area disposed between the hole peripheral area and the main area, the data lines include hole cross data lines that cross the hole area or the hole peripheral area, the hole cross data line includes:

a first cross division portion adjacent to the sub-area and disposed between the non-display area and a side of the hole area; and a second cross division portion disposed between another side of the hole area and the non-display area, the first auxiliary lines further include:

a first hole bypass line electrically connected to the first cross division portion; and a second hole bypass line electrically connected to the second cross division portion, and the second auxiliary lines further include a third hole bypass line electrically connecting the first hole bypass line and the second hole bypass line.

* * * * *